(12) United States Patent
Regner

(10) Patent No.: US 8,641,914 B2
(45) Date of Patent: Feb. 4, 2014

(54) METHODS OF IMPROVING LONG RANGE ORDER IN SELF-ASSEMBLY OF BLOCK COPOLYMER FILMS WITH IONIC LIQUIDS

(75) Inventor: Jennifer Kahl Regner, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/474,208

(22) Filed: May 17, 2012

(65) Prior Publication Data

US 2012/0223052 A1 Sep. 6, 2012

Related U.S. Application Data

(62) Division of application No. 12/053,006, filed on Mar. 21, 2008, now Pat. No. 8,425,982.

(51) Int. Cl.
*H01L 21/302* (2006.01)
*B82Y 40/00* (2011.01)

(52) U.S. Cl.
USPC .............. 216/17; 216/18; 216/19; 216/41; 216/49; 216/51; 216/55; 216/58; 216/83; 438/694; 438/700; 438/947

(58) Field of Classification Search
None
See application file for complete search history.

(56) References Cited

U.S. PATENT DOCUMENTS

| | | |
|---|---|---|
| 4,623,674 A | 11/1986 | Bailey et al. |
| 4,797,357 A | 1/1989 | Mura et al. |
| 4,818,713 A | 4/1989 | Feygenson |
| 4,877,647 A | 10/1989 | Klabunde |
| 5,328,810 A | 7/1994 | Lowrey et al. |
| 5,374,367 A | 12/1994 | Edamura et al. |
| 5,382,373 A | 1/1995 | Carlson |
| 5,482,656 A | 1/1996 | Hiraoka et al. |
| 5,512,131 A | 4/1996 | Kumar et al. |
| 5,538,655 A | 7/1996 | Fauteux |
| 5,580,700 A | 12/1996 | Rahman |
| 5,620,850 A | 4/1997 | Bamdad et al. |
| 5,622,668 A | 4/1997 | Thomas |
| 5,772,905 A | 6/1998 | Chou |
| 5,834,583 A | 11/1998 | Hancock et al. |
| 5,849,810 A | 12/1998 | Muller |
| 5,879,582 A | 3/1999 | Havelka et al. |
| 5,879,853 A | 3/1999 | Azuma |
| 5,891,356 A | 4/1999 | Inoue et al. |
| 5,904,824 A | 5/1999 | Oh |
| 5,925,259 A | 7/1999 | Biebuyck et al. |

(Continued)

FOREIGN PATENT DOCUMENTS

| | | |
|---|---|---|
| CN | 1562730 | 1/2005 |
| CN | 1799131 A | 7/2006 |

(Continued)

OTHER PUBLICATIONS

Ali, H.A., et al., Solid-State Electronics 46 (2002), 1639-1642.

(Continued)

*Primary Examiner* — Anita Alanko
(74) *Attorney, Agent, or Firm* — TraskBritt

(57) ABSTRACT

Methods for fabricating arrays of nanoscaled alternating lamellae or cylinders in a polymer matrix having improved long range order utilizing self-assembling block copolymers, and films and devices formed from these methods are provided.

22 Claims, 16 Drawing Sheets

(56) References Cited

U.S. PATENT DOCUMENTS

| | | |
|---|---|---|
| 5,948,470 A | 9/1999 | Harrison et al. |
| 5,958,704 A | 9/1999 | Starzl et al. |
| 6,051,869 A | 4/2000 | Pan et al. |
| 6,111,323 A | 8/2000 | Carter et al. |
| 6,143,647 A | 11/2000 | Pan et al. |
| 6,153,495 A | 11/2000 | Kub et al. |
| 6,207,787 B1 | 3/2001 | Fahey et al. |
| 6,251,791 B1 | 6/2001 | Tsai et al. |
| 6,270,946 B1 | 8/2001 | Miller |
| 6,309,580 B1 | 10/2001 | Chou |
| 6,310,138 B1 | 10/2001 | Yonezawa et al. |
| 6,312,971 B1 | 11/2001 | Amundson et al. |
| 6,368,871 B1 | 4/2002 | Christel et al. |
| 6,403,382 B1 | 6/2002 | Zhu et al. |
| 6,414,164 B1 | 7/2002 | Afzali-Ardakani et al. |
| 6,423,465 B1 | 7/2002 | Hawker et al. |
| 6,423,474 B1 | 7/2002 | Holscher |
| 6,503,841 B1 | 1/2003 | Criscuolo |
| 6,506,660 B2 | 1/2003 | Holmes et al. |
| 6,517,933 B1 | 2/2003 | Soane et al. |
| 6,518,194 B2 | 2/2003 | Winningham et al. |
| 6,537,920 B1 | 3/2003 | Krivokapic |
| 6,548,830 B1 | 4/2003 | Noguchi et al. |
| 6,565,763 B1 | 5/2003 | Asakawa |
| 6,565,764 B2 | 5/2003 | Hiraoka et al. |
| 6,566,248 B1 | 5/2003 | Wang et al. |
| 6,569,528 B2 | 5/2003 | Nam et al. |
| 6,573,030 B1 | 6/2003 | Fairbairn et al. |
| 6,592,764 B1 | 7/2003 | Stucky et al. |
| 6,630,520 B1 | 10/2003 | Bruza et al. |
| 6,635,912 B2 | 10/2003 | Ohkubo |
| 6,656,308 B2 | 12/2003 | Hougham et al. |
| 6,679,996 B1 | 1/2004 | Yao |
| 6,682,660 B2 | 1/2004 | Sucholeiki et al. |
| 6,689,473 B2 | 2/2004 | Guire et al. |
| 6,699,797 B1 | 3/2004 | Morris et al. |
| 6,713,238 B1 | 3/2004 | Chou et al. |
| 6,746,825 B2 | 6/2004 | Nealey et al. |
| 6,767,693 B1 | 7/2004 | Okoroanyanwu |
| 6,780,492 B2 | 8/2004 | Hawker et al. |
| 6,781,166 B2 | 8/2004 | Lieber et al. |
| 6,797,202 B2 | 9/2004 | Endo et al. |
| 6,809,210 B2 | 10/2004 | Chandross et al. |
| 6,812,132 B2 | 11/2004 | Ramachandrarao et al. |
| 6,825,358 B2 | 11/2004 | Afzali-Ardakani et al. |
| 6,884,842 B2 | 4/2005 | Soane et al. |
| 6,887,332 B1 | 5/2005 | Kagan et al. |
| 6,890,624 B1 | 5/2005 | Kambe et al. |
| 6,890,703 B2 | 5/2005 | Hawker et al. |
| 6,908,861 B2 | 6/2005 | Sreenivasan et al. |
| 6,911,400 B2 | 6/2005 | Colburn et al. |
| 6,913,697 B2 | 7/2005 | Lopez et al. |
| 6,924,341 B2 | 8/2005 | Mays |
| 6,926,953 B2 | 8/2005 | Nealey et al. |
| 6,940,485 B2 | 9/2005 | Noolandi |
| 6,946,332 B2 | 9/2005 | Loo et al. |
| 6,949,456 B2 | 9/2005 | Kumar |
| 6,952,436 B2 | 10/2005 | Wirnsberger et al. |
| 6,957,608 B1 | 10/2005 | Hubert et al. |
| 6,962,823 B2 | 11/2005 | Empedocles et al. |
| 6,989,426 B2 | 1/2006 | Hu et al. |
| 6,992,115 B2 | 1/2006 | Hawker et al. |
| 6,995,439 B1 | 2/2006 | Hill et al. |
| 6,998,152 B2 | 2/2006 | Uhlenbrock |
| 7,001,795 B2 | 2/2006 | Jiang et al. |
| 7,009,227 B2 | 3/2006 | Patrick et al. |
| 7,030,495 B2 | 4/2006 | Colburn et al. |
| 7,037,738 B2 | 5/2006 | Sugiyama et al. |
| 7,037,744 B2 | 5/2006 | Colburn et al. |
| 7,045,851 B2 | 5/2006 | Black et al. |
| 7,056,455 B2 | 6/2006 | Matyjaszewski et al. |
| 7,056,849 B2 | 6/2006 | Wan et al. |
| 7,060,774 B2 | 6/2006 | Sparrowe et al. |
| 7,066,801 B2 | 6/2006 | Balijepalli et al. |
| 7,077,992 B2 | 7/2006 | Sreenivasan et al. |
| 7,087,267 B2 | 8/2006 | Breen et al. |
| 7,090,784 B2 | 8/2006 | Asakawa et al. |
| 7,112,617 B2 | 9/2006 | Kim |
| 7,115,305 B2 | 10/2006 | Bronikowski et al. |
| 7,115,525 B2 | 10/2006 | Abatchev et al. |
| 7,115,995 B2 | 10/2006 | Wong |
| 7,118,784 B1 | 10/2006 | Xie |
| 7,119,321 B2 | 10/2006 | Quinlan |
| 7,132,370 B2 | 11/2006 | Paraschiv |
| 7,135,144 B2 | 11/2006 | Christel et al. |
| 7,135,241 B2 | 11/2006 | Ferraris et al. |
| 7,135,388 B2 | 11/2006 | Ryu et al. |
| 7,135,523 B2 | 11/2006 | Ho et al. |
| 7,151,209 B2 | 12/2006 | Empedocles et al. |
| 7,163,712 B2 | 1/2007 | Chilkoti et al. |
| 7,166,304 B2 | 1/2007 | Harris et al. |
| 7,172,953 B2 | 2/2007 | Lieber et al. |
| 7,186,613 B2 | 3/2007 | Kirner |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,195,733 B2 | 3/2007 | Rogers et al. |
| 7,202,308 B2 * | 4/2007 | Boussand et al. ............. 525/338 |
| 7,208,836 B2 | 4/2007 | Manning |
| 7,252,791 B2 | 8/2007 | Wasserscheid et al. |
| 7,259,101 B2 | 8/2007 | Zurcher et al. |
| 7,279,396 B2 | 10/2007 | Derderian et al. |
| 7,282,240 B1 | 10/2007 | Jackman et al. |
| 7,291,284 B2 | 11/2007 | Mirkin et al. |
| 7,311,943 B2 | 12/2007 | Jacobson et al. |
| 7,326,514 B2 | 2/2008 | Dai et al. |
| 7,332,370 B2 | 2/2008 | Chang et al. |
| 7,332,627 B2 | 2/2008 | Chandross et al. |
| 7,338,275 B2 | 3/2008 | Choi et al. |
| 7,347,953 B2 | 3/2008 | Black et al. |
| 7,368,314 B2 | 5/2008 | Ufert |
| 7,407,887 B2 | 8/2008 | Guo |
| 7,408,186 B2 | 8/2008 | Merkulov et al. |
| 7,419,772 B2 | 9/2008 | Watkins et al. |
| 7,470,954 B2 | 12/2008 | Lee et al. |
| 7,514,339 B2 | 4/2009 | Yang et al. |
| 7,521,090 B1 | 4/2009 | Cheng et al. |
| 7,553,760 B2 | 6/2009 | Yang et al. |
| 7,569,855 B2 | 8/2009 | Lai |
| 7,585,741 B2 | 9/2009 | Manning |
| 7,592,247 B2 | 9/2009 | Yang et al. |
| 7,605,081 B2 | 10/2009 | Yang et al. |
| 7,632,544 B2 | 12/2009 | Ho et al. |
| 7,655,383 B2 | 2/2010 | Mela et al. |
| 7,658,773 B2 | 2/2010 | Pinnow |
| 7,700,157 B2 | 4/2010 | Bronikowski et al. |
| 7,767,099 B2 | 8/2010 | Li et al. |
| 7,888,228 B2 | 2/2011 | Blanchard |
| 7,959,975 B2 | 6/2011 | Millward |
| 7,964,107 B2 | 6/2011 | Millward |
| 8,039,196 B2 | 10/2011 | Kim et al. |
| 8,083,953 B2 | 12/2011 | Millward et al. |
| 8,083,958 B2 | 12/2011 | Li et al. |
| 8,097,175 B2 | 1/2012 | Millward et al. |
| 8,101,261 B2 | 1/2012 | Millward et al. |
| 8,114,300 B2 | 2/2012 | Millward |
| 8,294,139 B2 | 10/2012 | Marsh et al. |
| 2001/0024768 A1 | 9/2001 | Matsuo et al. |
| 2001/0049195 A1 | 12/2001 | Chooi et al. |
| 2002/0055239 A1 | 5/2002 | Tuominen et al. |
| 2002/0084429 A1 | 7/2002 | Craighead et al. |
| 2002/0158342 A1 | 10/2002 | Tuominen et al. |
| 2002/0167117 A1 | 11/2002 | Chou |
| 2003/0010241 A1 | 1/2003 | Fujihira et al. |
| 2003/0034329 A1 | 2/2003 | Chou |
| 2003/0068639 A1 | 4/2003 | Haneder et al. |
| 2003/0077452 A1 | 4/2003 | Guire et al. |
| 2003/0080471 A1 | 5/2003 | Chou |
| 2003/0080472 A1 | 5/2003 | Chou |
| 2003/0091752 A1 | 5/2003 | Nealey et al. |
| 2003/0100822 A1 | 5/2003 | Lew et al. |
| 2003/0108879 A1 | 6/2003 | Klaerner et al. |
| 2003/0157248 A1 | 8/2003 | Watkins et al. |
| 2003/0178707 A1 | 9/2003 | Abbott |

(56) References Cited

U.S. PATENT DOCUMENTS

| | | |
|---|---|---|
| 2003/0180522 A1 | 9/2003 | DeSimone et al. |
| 2003/0180966 A1 | 9/2003 | Abbott et al. |
| 2003/0185741 A1 | 10/2003 | Matyjaszewski |
| 2003/0222048 A1 | 12/2003 | Asakawa et al. |
| 2003/0235930 A1 | 12/2003 | Bao et al. |
| 2004/0023287 A1 | 2/2004 | Harnack et al. |
| 2004/0028875 A1 | 2/2004 | Van Rijn et al. |
| 2004/0058059 A1 | 3/2004 | Linford et al. |
| 2004/0084298 A1 | 5/2004 | Yao et al. |
| 2004/0124092 A1 | 7/2004 | Black et al. |
| 2004/0125266 A1 | 7/2004 | Miyauchi et al. |
| 2004/0127001 A1 | 7/2004 | Colburn |
| 2004/0142578 A1 | 7/2004 | Wiesner et al. |
| 2004/0159633 A1 | 8/2004 | Whitesides et al. |
| 2004/0163758 A1 | 8/2004 | Kagan et al. |
| 2004/0175628 A1 | 9/2004 | Nealey et al. |
| 2004/0192013 A1 | 9/2004 | Ryu et al. |
| 2004/0222415 A1 | 11/2004 | Chou |
| 2004/0242688 A1 | 12/2004 | Chandross et al. |
| 2004/0254317 A1 | 12/2004 | Hu |
| 2004/0256615 A1 | 12/2004 | Sirringhaus et al. |
| 2004/0256662 A1 | 12/2004 | Black et al. |
| 2004/0265548 A1 | 12/2004 | Ho et al. |
| 2005/0008828 A1 | 1/2005 | Libera et al. |
| 2005/0062165 A1 | 3/2005 | Saenger et al. |
| 2005/0074706 A1 | 4/2005 | Bristol |
| 2005/0079486 A1 | 4/2005 | Abbott et al. |
| 2005/0100830 A1 | 5/2005 | Xu et al. |
| 2005/0120902 A1 | 6/2005 | Adams et al. |
| 2005/0124135 A1 | 6/2005 | Ayazi et al. |
| 2005/0133697 A1 | 6/2005 | Potyrailo et al. |
| 2005/0147841 A1 | 7/2005 | Tavkhelidze et al. |
| 2005/0167651 A1 | 8/2005 | Merkulov et al. |
| 2005/0176256 A1 | 8/2005 | Kudelka |
| 2005/0208752 A1 | 9/2005 | Colburn et al. |
| 2005/0238889 A1 | 10/2005 | Iwamoto |
| 2005/0238967 A1 | 10/2005 | Rogers et al. |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0024590 A1 | 2/2006 | Sandhu |
| 2006/0030495 A1 | 2/2006 | Gregg |
| 2006/0035387 A1 | 2/2006 | Wagner et al. |
| 2006/0038182 A1 | 2/2006 | Rogers et al. |
| 2006/0046079 A1 | 3/2006 | Lee |
| 2006/0046480 A1 | 3/2006 | Guo |
| 2006/0060863 A1 | 3/2006 | Lu et al. |
| 2006/0062867 A1 | 3/2006 | Choi |
| 2006/0078681 A1 | 4/2006 | Hieda et al. |
| 2006/0097134 A1 | 5/2006 | Rhodes |
| 2006/0105562 A1 | 5/2006 | Yi |
| 2006/0124467 A1 | 6/2006 | Ho et al. |
| 2006/0128165 A1 | 6/2006 | Theiss et al. |
| 2006/0134556 A1 | 6/2006 | Nealey et al. |
| 2006/0137554 A1 | 6/2006 | Kron et al. |
| 2006/0141222 A1 | 6/2006 | Fischer et al. |
| 2006/0141245 A1 | 6/2006 | Stellacci et al. |
| 2006/0154466 A1 | 7/2006 | Lee et al. |
| 2006/0163646 A1 | 7/2006 | Black |
| 2006/0192283 A1 | 8/2006 | Benson |
| 2006/0205875 A1 | 9/2006 | Cha et al. |
| 2006/0211871 A1 | 9/2006 | Dai |
| 2006/0217285 A1 | 9/2006 | Destarac |
| 2006/0228635 A1 | 10/2006 | Suleski |
| 2006/0231525 A1 | 10/2006 | Asakawa et al. |
| 2006/0249784 A1 | 11/2006 | Black et al. |
| 2006/0249796 A1 | 11/2006 | Tavkhelidze et al. |
| 2006/0254440 A1 | 11/2006 | Choi et al. |
| 2006/0255505 A1 | 11/2006 | Sandhu et al. |
| 2006/0257633 A1 | 11/2006 | Inoue et al. |
| 2006/0258159 A1 | 11/2006 | Colburn et al. |
| 2006/0278158 A1 | 12/2006 | Tolbert et al. |
| 2006/0281266 A1 | 12/2006 | Wells |
| 2006/0286305 A1 | 12/2006 | Thies et al. |
| 2006/0286490 A1 | 12/2006 | Sandhu et al. |
| 2006/0292777 A1 | 12/2006 | Dunbar |
| 2007/0020749 A1 | 1/2007 | Nealey et al. |
| 2007/0023247 A1 | 2/2007 | Ulicny et al. |
| 2007/0023805 A1 | 2/2007 | Wells |
| 2007/0045562 A1 | 3/2007 | Parekh |
| 2007/0045642 A1 | 3/2007 | Li |
| 2007/0071881 A1 | 3/2007 | Chua et al. |
| 2007/0072403 A1 | 3/2007 | Sakata |
| 2007/0122749 A1 | 5/2007 | Fu et al. |
| 2007/0122932 A1 | 5/2007 | Kodas et al. |
| 2007/0138131 A1 | 6/2007 | Burdinski |
| 2007/0161237 A1 | 7/2007 | Lieber et al. |
| 2007/0175859 A1 | 8/2007 | Black et al. |
| 2007/0181870 A1 | 8/2007 | Libertino et al. |
| 2007/0183035 A1 | 8/2007 | Asakawa et al. |
| 2007/0194403 A1 | 8/2007 | Cannon et al. |
| 2007/0200477 A1 | 8/2007 | Tuominen et al. |
| 2007/0208159 A1 | 9/2007 | McCloskey et al. |
| 2007/0218202 A1 | 9/2007 | Ajayan et al. |
| 2007/0222995 A1 | 9/2007 | Lu |
| 2007/0224819 A1 | 9/2007 | Sandhu |
| 2007/0224823 A1 | 9/2007 | Sandhu |
| 2007/0227383 A1 | 10/2007 | Decre et al. |
| 2007/0249117 A1 | 10/2007 | Kang et al. |
| 2007/0272951 A1 | 11/2007 | Lieber et al. |
| 2007/0281220 A1 | 12/2007 | Sandhu et al. |
| 2007/0289943 A1 | 12/2007 | Lu et al. |
| 2007/0293041 A1 | 12/2007 | Yang et al. |
| 2008/0032238 A1 | 2/2008 | Lu et al. |
| 2008/0038467 A1 | 2/2008 | Jagannathan et al. |
| 2008/0038923 A1 | 2/2008 | Edelstein et al. |
| 2008/0041818 A1 | 2/2008 | Kihara et al. |
| 2008/0047930 A1 | 2/2008 | Blanchet et al. |
| 2008/0064217 A1 | 3/2008 | Horii |
| 2008/0073743 A1 | 3/2008 | Alizadeh et al. |
| 2008/0083991 A1 | 4/2008 | Yang et al. |
| 2008/0085601 A1 | 4/2008 | Park et al. |
| 2008/0093743 A1 | 4/2008 | Yang et al. |
| 2008/0102252 A1 | 5/2008 | Black et al. |
| 2008/0103256 A1 | 5/2008 | Kim et al. |
| 2008/0113169 A1 | 5/2008 | Cha et al. |
| 2008/0164558 A1 | 7/2008 | Yang et al. |
| 2008/0174726 A1 | 7/2008 | Kim |
| 2008/0176767 A1 | 7/2008 | Millward |
| 2008/0193658 A1 | 8/2008 | Millward |
| 2008/0217292 A1 | 9/2008 | Millward et al. |
| 2008/0233297 A1 | 9/2008 | de Jong et al. |
| 2008/0233323 A1 | 9/2008 | Cheng et al. |
| 2008/0257187 A1 | 10/2008 | Millward |
| 2008/0260941 A1 | 10/2008 | Jin |
| 2008/0274413 A1 | 11/2008 | Millward |
| 2008/0286659 A1 | 11/2008 | Millward |
| 2008/0311347 A1 | 12/2008 | Millward et al. |
| 2008/0315270 A1 | 12/2008 | Marsh et al. |
| 2008/0318005 A1 | 12/2008 | Millward |
| 2009/0062470 A1 | 3/2009 | Millward et al. |
| 2009/0155579 A1 | 6/2009 | Greco et al. |
| 2009/0200646 A1 | 8/2009 | Millward et al. |
| 2009/0206489 A1 | 8/2009 | Li et al. |
| 2009/0212016 A1 | 8/2009 | Cheng et al. |
| 2009/0218567 A1 | 9/2009 | Mathew et al. |
| 2009/0236309 A1 | 9/2009 | Millward et al. |
| 2009/0240001 A1 | 9/2009 | Regner |
| 2009/0263628 A1 | 10/2009 | Millward |
| 2009/0267058 A1 | 10/2009 | Namdas et al. |
| 2009/0274887 A1 | 11/2009 | Millward et al. |
| 2009/0317540 A1 | 12/2009 | Sandhu et al. |
| 2010/0092873 A1 | 4/2010 | Sills et al. |
| 2010/0102415 A1 | 4/2010 | Millward et al. |
| 2010/0124826 A1 | 5/2010 | Millward et al. |
| 2010/0137496 A1 | 6/2010 | Millward et al. |
| 2010/0163180 A1 | 7/2010 | Millward |
| 2010/0204402 A1 | 8/2010 | Millward et al. |
| 2010/0279062 A1 | 11/2010 | Millward |
| 2010/0316849 A1 | 12/2010 | Millward et al. |
| 2010/0323096 A1 | 12/2010 | Sills et al. |

(56) References Cited

U.S. PATENT DOCUMENTS

| | | |
|---|---|---|
| 2011/0232515 A1 | 9/2011 | Millward |
| 2012/0133017 A1 | 5/2012 | Millward et al. |
| 2012/0223053 A1 | 9/2012 | Millward et al. |

FOREIGN PATENT DOCUMENTS

| | | |
|---|---|---|
| CN | 101013662 A | 8/2007 |
| EP | 0784543 B1 | 4/2000 |
| EP | 1416303 A2 | 5/2004 |
| EP | 1906237 A2 | 4/2008 |
| EP | 1593164 B1 | 6/2010 |
| JP | 11080414 | 3/1999 |
| JP | 2003155365 | 5/2003 |
| JP | 2003155365 A | 5/2003 |
| JP | 2004335962 | 11/2004 |
| JP | 2004335962 A | 11/2004 |
| JP | 2005029779 A | 2/2005 |
| JP | 2006036923 | 2/2005 |
| JP | 2006055982 | 3/2006 |
| JP | 2006110434 A | 4/2006 |
| JP | 2005008882 | 7/2006 |
| JP | 2007194175 A | 8/2007 |
| JP | 2008036491 | 2/2008 |
| KR | 20060128378 A | 12/2006 |
| KR | 20070029762 A | 3/2007 |
| KR | 100771886 B1 | 11/2007 |
| TW | 200400990 A | 1/2004 |
| TW | 584670 B | 4/2004 |
| TW | 200419017 | 10/2004 |
| TW | 200511364 | 3/2005 |
| TW | I253456 | 4/2006 |
| TW | 256110 | 6/2006 |
| TW | 200633925 A | 10/2006 |
| TW | 200740602 A | 11/2007 |
| TW | 200802421 A | 1/2008 |
| WO | 9007575 | 7/1990 |
| WO | 9706013 | 2/1997 |
| WO | 98/39645 | 9/1998 |
| WO | 9947570 | 9/1999 |
| WO | 0031183 A1 | 6/2000 |
| WO | 0218080 A1 | 3/2002 |
| WO | 02081372 A2 | 10/2002 |
| WO | 03045840 A2 | 6/2003 |
| WO | 2005122285 A2 | 12/2005 |
| WO | 2006003592 A2 | 1/2006 |
| WO | 2006003594 A2 | 1/2006 |
| WO | 2006076016 | 7/2006 |
| WO | 2006078952 | 7/2006 |
| WO | 2006112887 A2 | 10/2006 |
| WO | 2007001294 | 1/2007 |
| WO | 2007/013889 A2 | 2/2007 |
| WO | 2007019439 A3 | 2/2007 |
| WO | 2007024241 | 3/2007 |
| WO | 2007024323 A2 | 3/2007 |
| WO | 2007055041 | 5/2007 |
| WO | 2008091741 A2 | 7/2008 |
| WO | 2008055137 A3 | 8/2008 |
| WO | 2008096335 A2 | 8/2008 |
| WO | 2008097736 A2 | 8/2008 |
| WO | 2008118635 A2 | 10/2008 |
| WO | 2008124219 A2 | 10/2008 |
| WO | 2008130847 A1 | 10/2008 |
| WO | 2008145268 A2 | 12/2008 |
| WO | 2008156977 A2 | 12/2008 |
| WO | 2009099924 A2 | 8/2009 |
| WO | 2009102551 A2 | 8/2009 |
| WO | 2009117238 A2 | 9/2009 |
| WO | 2009117243 A1 | 9/2009 |
| WO | 2009134635 A2 | 11/2009 |

OTHER PUBLICATIONS

Arshady et al., Makromol. Chem., 1976, vol. 177, p. 2911-2918.
Bae, Joonwon, Surface Modification Using Photo-Crosslinkable Random Copolymers, Abstract submitted for the Mar. 2006 meeting of The American Physical Society, submitted Nov. 30, 2005.
Balsara et al, CPIMA, IRG Technical Programs, Synthesis and application of Nanostructured Materials, Leland Stanford Junior Univ., 2006, http://www.stanford.edu/group/cpima/irg/irg_1.htm, printed Jul. 1, 2009.
Bang, J., Abstract submitted for the Mar. 6 meeting of the American Physical Society, submitted Nov. 2005 (online), accessed via the Internet (retrieved on Apr. 5, 2010), URL: <http://absimage.aps.org/image/MWS_MAR06-2005-003641.pdf>.
Bang, Joona, The Effect of Humidity on the Ordering of Tri-block Copolymer Thin Films, Abstract submitted for the Mar. 2007 meeting of The American Physical Society, submitted Nov. 20, 2006.
Bass, Robert B., et al., Microcontact Printing with Octadecanethiol, Applied Surface Science, 226(4), pp. 335-340, Apr. 2004, http://www.ece.virginia.edu/UVML/sis/Papers/rbbpapers/assoct.pdf.
Bearinger, J.P., et al., Nature Materials 2, 259-264, 2003.
Berry, B.C., et al., Effects of Zone Annealing on Thin Films of Block Copolymers, National Institute of Standard and Technology, Polymers Division, Gaithersburg, MD., 2007.
Black, C.T., IEEE 2005 Custom Integrated Circuits Conference, pp. 87-91.
Black, C.T., et al., IBM J. Res. & Dev., vol. 51, No. 5, Sep. 2007, pp. 605-633.
Black, C.T., Proc. of SPIE, vol. 6153, 615302 (2006).
Nguyen, Kytai, et al., Biomaterials 23, 2002, pp. 4307-4314.
Black, Charles T., ACSNano, vol. 1, No. 3, 2007, American Chemical Society, pp. 147-150.
Black, Charles T., et al., IEEE Electronon Device Letters, vol. 25, No. 9, Sep. 2004, pp. 622-624.
Botelho do Rego, A.M., et al., Surface Science, 482-485 (2001), pp. 1228-1234.
Brydson, Rik M., et al. (chapter authors), Generic Methodologies for Nanotechnology: Classification and Fabrication, Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/SUMMARY).
Bulpitt, Paul et al, Journal of Biomedical Materials Research, vol. 47, Issue 2, pp. 152-169, Abstract only.
Canaria, Christi A., et al., Formation and Removal of Alkylthiolate Self-Assembled Monolayers on Gold in Aqueous Solutions, Lab Chip 6, 289-295 (2006), http://www.rsc.org/publishing/journals/LC/article.asp?doi=b51066c] (Abstract).
Candau et al., Polymer, 1977, vol. 18, p. 1253-1257.
Cavicchi, Kevin A., et al., Macromolecules 2007, vol. 40, 2007, pp. 1181-1186.
Chandekar, Amol, et al., Template-Directed Adsorption of block Copolymers on Alkanethiol-Patterned Gold Surfaces, (circa 2006), http://www.nano.neu.edu/industry/industry_showcase/industry_day/documents/Chandekar.pdf) (Powerpoint template for scientific posters (Swarthmore College)).
Cheng, Joy T., et al., Nano Letters, vol. 0, No. 0, A-E, published on Web Aug. 16, 2006.
Cheng, Joy Y., et al., Nano Letters, vol. 6, No. 9, 2006, pp. 2009-2103.
Cheng, Joy Y., et al., Adv. Mater. 2003, vol. 15, No. 19, pp. 1599-1602.
Cheng, Joy Y., et al., Applied Physics Letters, 91, 143106-143106-3 (2007).
Daoulas Kostas Ch., et al., Physical Review Letters 96, week ending Jan. 27, 2006, pp. 036104-1-036104-3.
Darling, S.B., Progress in Polymer Science, vol. 32, No. 10, Sep. 28, 2007, pp. 1152-1204.
Desai, Dr. Trejal A., et al., Business Briefing: Medical Device Manufacturing & Technology, 2002.
Edwards, Erik W., et al., Journal of Polymer Science: Part B Polymer Physics, vol. 43, 3444-3459, 2005.
Edwards, Erik W., et al., Advanced Mater, 16, No. 15, Aug. 4, 2004, pp. 1315-1319.
Elisseeff J., et al., Journal of Biomedical Materials Research, 51(2): 164-171, Aug. 2000, Abstract only.
Fasolka, Michael J. et al., Macromolecules 2000 vol. 33, No. 15, pp. 5702-5712.
Gates, Byron D., et al., Annu. Rev. Mater. Res. 2004, 34:339-72.

(56) References Cited

OTHER PUBLICATIONS

Ge, Zhenbin, et al., PRL 96, 186101-1 186101-4, The American Physical Society, week ending May 12, 2006.
Gelest Inc., Silane Coupling Agents: Connecting Across Boundaries, pp. 1-56, 2006.
Genua, A., et al., Nanotechnology, 18 (2007), pp. 1-7.
Gillmor, S.D., et al., Langmuir 2000, vol. 16, No. 18, 2000, pp. 7223-7228.
Gudipati, Chakravarthy S., et al., Journal of Polymer Science Part A: Polymer Chemistry, vol. 42, pp. 6193-6208.
Guo, Kai, et al., Abstract of Synthesis and Characterization of Novel Biodegradable Unsaturated Poly(ester amide)/ Poly(ethylene glycol) Diacrylate Hydrogels, Journal of Polymer Science Part A: Polymer Chemistry, vol. 43, Issue 17, pp. 3932-3944, 2005 Wiley Periodicals, Inc.
Hamley, I. W., Introduction to Block Copolymers, Developments in Block Copolymers Science and Technology, 2004, John Wiley & Sons, Ltd., pp. 1-29.
Harrison, Christopher et al., Polymer, vol. 39, No. 13, pp. 2733-2744, 1998.
Hawker, et al., Facile Synthesis of Block Copolymers for Nanolithographic Applications; Polymer Reprints, 2005.
He, Yiyong et al., J. Am. Chem. Soc. 2006, 128, 2745-2750.
Hermans, Thomas M., et al., Application of Solvent-Directed Assembly of Block Copolymers to the Synthesis of Nanostructured Materials with Low Dielectric Constants, Angewandte Chem. Int. Ed. 2006, 45, pp. 6648-6652.
Hutchison, J. Brian, et al., Chem. Mater., vol. 17, No. 19, 2005, pp. 4789-4797.
In, Insik, et al., Langmuir, vol. 22, No. 18, 2006, pp. 7855-7860.
Ji, Shengxiang, et al., Preparation of Neutral Wetting Brushes for Block Copolymer Films from Homopolymer Blends, submitted to Advanced Materials, 20[16]: 3054-3060; published online Jul. 7, 2008.
Ji, Shengxiang, et al., Macromolecules, 2008, 41(23): 9098-9103.
Jun, et al., Langmuir, 2002, 18(9), pp. 3415-3417, Abstract only.
Karim, Alamgir et al., Control of Ordering Kinetics and Morphology Using Zone Annealing of Thin Block Copolymer Filmes, Abstract submitted for the Mar. 2007 Meeting of The American Physical Society, Nov. 20, 2006.
Kim, IS, et al., Int J Pharm., Sep. 15, 2000; 205(1-2): 109-16, Abstract only.
Kim, Sang Ouk, et al., Nature, vol. 424, Jul. 24, 2003, pp. 411-414.
Kim, Sang Ouk, et al., Adv. Mater., 2007, 19, pp. 3271-3275.
Kim, Seung Hyun, et al., Adv. Mater. 2004, 16, No. 3, Feb. 3, pp. 226-231.
Kim, Seung Hyun, et al., Macromolecules 2006, vol. 39, No. 24, 2006, pp. 8473-8479.
Kim, Seung Hyun, et al., Advanced Mater., vol. 16, No. 23-24, pp. 2119-2123, Dec. 17, 2004.
Kim, SH, J Biomater Appl., Jul. 2000; 15(1): 23-46 Abstract only.
Kim, SH, J Biomater Res., Mar. 15, 2000; 49(4): 517-27 Abstract only.
Kim, Su-Jin, et al., J. Vac. Sci. Technol. B26(1), Jan./Feb. 2008, 189-194.
Krishnamoorthy, Sivashankar, et al., MaterialsToday, vol. 9, No. 9, Sep. 2006, pp. 40-47.
La, Young-Hye, et al., Chem. Mater, 2007, vol. 19, No. 18, pp. 4538-4544.
La, Young-Hye, et al., J. Vac. Sci. Technol. B 25[6], Nov./Dec. 2007, pp. 2508-2513.
Laracuente, A.R., et al., Surface Science 545, 2003, pp. 70-84.
Lentz, David, et al., Whole Wafer Imprint Patterning Using Step and Flash Imprint Lithography: A Manufacturing Solution for Sub 100 nm Patterning, SPIE Advanced Lithography Paper, http://molecularimprints. com/ NewsEvents/tech_articles/new_articles/SPIE_07_MII_WW_Paper.pdf], Feb. 2007, pp. 1-10.
Li, Mingqi, et al., MaterialsToday, vol. 9, No. 9, Sep. 2006, pp. 30-39.
Li, Wai-kin, et al, J. Vac. Sci. Technol. B 25[6], Nov./Dec. 2007, pp. 1982-1984.
Li, Xue, et al., ScienceDirect, Polymer 48 [2007], pp. 2434-2443.
Lin, Zhiqun, et al., Adv. Mater. 2002, 14 No. 19, Oct. 2, pp. 1373-1376.
Lin-Gibson, Sheng, et al., Macromolecules 2005, 38, pp. 2897-2902.
Lutolf, M.P., et al, Nature Biotechnology, 23, 47-55 (2005), Abstract only.
Malkoch, Michael, et al., Chem. Commun., 2006, pp. 2774-2776.
Mansky, P., et al., Science, vol. 275, Mar. 7, 1997, pp. 1458-1460.
Martens, P., et al., Polymer, vol. 41, Issue 21, Oct. 2000, pp. 7715-7722, Abstract only.
Matsuda, T., et al., ASAIO J, Jul.-Sep. 1992; 38(3): M154-7, Abstract only.
Maye, Mathew A., et al., Journal of Chemical Education, vol. 79, No. 2, Feb. 2002, pp. 207-210.
Metters, Andrew, et al., Biomacromolecules 2005, 6, pp. 290-301, 2005.
Meyer, Evelyn, et al., Macromollecular Mater. Eng., 276/277, 2000, pp. 44-50.
Mezzenga, Raffaele, et al., Langmuir 2003, vol. 19, No. 20, 2003, pp. 8144-8147.
Mindel, Joseph., et.al., A Study of Bredig Platinum Sols, The Chemical Laboratories of New York University, vol. 65 pp. 2112.
Nealey, Paul F., et al., Self-Assembling Resists for Nanolithography, IEEE 2005.
Naito, et al., IEEE Transactions on Magnetics, vol. 38, No. 5, Sep. 2002, pp. 1949-1951.
Nishikubo, T., American Chemical Society Symposium Series, 1997, p. 214-230.
Niu, Sanjun, et al., Macromolecules, 36(7), 2428-2440, 2003 (web release date: Mar. 13, 2003) http://digitalcommons.uni.edu/cgi/viewcontent.cgi?article+1005&contect=chemeng_nanotechnology).
Olayo-Valles, Roberto et al., J. Mater. Chem., 2004, 14, 2729-2731.
Parejo, Pilar Garcia, et al., J. Mater. Chem., 2006, 16, pp. 2165-2169.
Park, Cheolmin, et al., Polymer 44, 2003, 6725-6760.
Park, Dae-Ho, Nanotechnology 18, 2007, 355304, pp. 1-7.
Park, Miri, et al., Science, v. 276, No. 5317, p. 1401-1404, May 30, 1997.
Park, Sang-Min, et al., Adv. Mater., 2007, 19, pp. 607-611.
Park, Sung Chan, et al., Macromolecules 2007, vol. 40, No. 22, pp. 8119-8124.
Peng, Juan et al., Macromol. Rapid Commun. 2007, 28, 1422-1428.
Peters, Richard D., et al., J. Vac. Sci. Technol. B, vol. 18, No. 6, Nov./Dec. 2000, pp. 3530-3532.
Peters, Richard D., et al., Macromolecules, vol. 35, No. 5, 2002, pp. 1822-1834.
Potemkin, Igor I., et al., Macromol. Rapid Commun., 2007, 28, pp. 579-584.
Resnick, Douglas, J., et al., J. Microlith., Microfab., Microsyst., vol. 3, No. 2, Apr. 2004, pp. 316-321.
Rogers, John A., ACS Nano, vol. 1, No. 3, pp. 151-153, 2007.
Rozkiewicz, Dorota I., et al., Angew. Chem. Int. Ed., 2006, 45, pp. 5292-5296.
Ruiz, Ricardo, et al., Adv. Mater, 2007, 19, pp. 587-591.
Ryu, Du Yeol, et al., Macromolecules, vol. 40, No. 12, 2007, pp. 4296-4300.
Saraf, Ravi R., et al., Applied Physics Letters, vol. 80, No. 23, Jun. 10, 2002, pp. 4425-4427.
Sawhney, Amarpreet S., et al., Macromolecules 1993, 26, 581-587, Abstract only.
Segalman, Rachel A., Materials Science and Engineering R 48 (2005), pp. 191-226.
Shahrjerdi, Davood, et al., IEEE Electron Device Letters, vol. 28, No. 9, Sep. 2007, pp. 793-796.
Sharma, Sadhana, et al., Applied Surface Science, 206 [2003], pp. 218-229.
Sivaniah, E., et al., Macromolecules 2003, 36, pp. 5894-5896.
Sivaniah, et al., Macromolecules 2005, 38, 1837-1849.
Solak, Harun H., Journal of Physics D: Applied Physics, 2006, pp. R171-R188.
Srinvivasan, Charan, et al., ACS Nano, vol. 1, No. 3, pp. 191-201, 2007.

(56) References Cited

OTHER PUBLICATIONS

Stoykovich, Mark P., et al., Science, vol. 308, Jun. 3, 2005, pp. 1442-1446.
Stoykovich, Mark P., et al., ACS Nano, vol. 1, No. 3, 2007, pp. 168-175.
Sundrani, Deepak, et al., Nano Lett., vol. 4, No. 2, 2004, pp. 273-276.
Sundrani, Deepak, et al., Langmuir 2004, vol. 20, No. 12, 2004, pp. 5091-5099.
Sigma-Aldrich, Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.
Van Poll, Maaike L., et al., Angew. Chem. Int. Ed. 2007, 46, pp. 6634-6637.
Wang, C., et al., Electrochimica Acta 52 (2006), pp. 704-709.
Wathier, Michel, et al., J. Am. Chem. Soc., 2004, 126 (40), pp. 12744-12745, Abstract only.
Winesett, D.A., et al., Langmuir 2003, 19, pp. 8526-8535.
Xiao, Shuaigang et al., Nanotechnology 16 (2005) S324-S329.
Xu, Ting et al., Polymer 42, [2001] 9091-9095.
Wu, C.Y., et al., IEEE, 2007, pp. 153-154.
Yamaguchi, Toru, et al., Journal of Photopolymer Science and Technology, vol. 19, No. 3, 2006, pp. 385-388.
Yan, Xiaohu, et al., J. Am. Chem. Soc., vol. 126, No. 32, 2004, pp. 10059-10066.
Yang, Xiao M., et al., Macromolecules 2000, vol. 33, No. 26, 2000, pp. 9575-9582.
Yang, XiaoMin, et al., J. Vac. Sci. Technol. B 22[6], Nov./Dec. 2004, 3331-3334.
Yurt, Serkan, et al., Macromolecules 2006, vol. 39, No. 5, 2006.
Zhang, Mingfu, et al., Adv. Mater. 2007, 19, pp. 1571-1576.
Berry et al., Nano Letters vol. 7, No. 9, Aug. 2007, p. 2789-2794.
Fukunaga et al., Macromolecules vol. 39, Aug. 2006, p. 6171-6179.
Hammond et al., Macromoleculars vol. 38, Jul. 2005, p. 6575-6585.
Knoll et al., "Phase Behavior in Thin Films of Cylinder-Forming Block Copolymers", Physical Review Letters, vol. 89, No. 3, Jul. 2002.
Zehner, et al., Langmuir, vol. 14, No. 2, pp. 241-244, Jan. 20, 1998.
Cha, Jennifer N., et al., Chem. Mater. 2007, 19, 839-843.
Chang, Li-Wen, Proc. of SPIE, vol. 6156, 2006, 615611-1 to 615611-6.
Chang, Li-Wen, IEEE International Electron Devices Meeting (IEDM), paper 33.2, Dec. 6-8, San Francisco, 2010, pp. 33.2.1-33.2.4.
Ikeda, Susumu et al., NanotechJapan Bulletin—vol. 3, No. 3, Dec. 17, 2010/Focus 26-06.
Ji, Shengxiang et al., ACS Nano, vol. 4, No. 2, 2010, pp. 599-609.
Metiers, Andrew, et al., Biomacromolecules 2005, 6, pp. 290-301, 2005.
Park, Seung Hak, et al., Soft Matter, 2010, 6, 2010, 120-125.
Wipf, "Handbook of Reagents for Organic Synthesis", 2005, John Wiley & Sons Ltd., p. 320.
Yamaguchi, Toru, et al., Microprocesses and Nanotechnology, 2007, Conference date Nov. 5-8, 2007, pp. 434-435.
Zhang, Yuan et al., Applied Physics Letter, 91, 013104, 2007, pp. 013104 to 013104-3.
Black, C.T., Applied Physics Letters 87, 163116-1 to 1163116-3, 2005.
Black, Charles T., IEEE Transactions on Nanotechnology, vol. 3, No. 3, Sep. 2004, pp. 412-415.
Choi et al., IEEE Transactions on Magnetics 41(10):3448-3450 (2005).
Hawker et al.,. "Improving the manufacturability and structural control of block copolymer lithography," Abstracts of Papers, 232nd ACS National Meeting, San Francisco, CA, Sep. 10 14, 2006.
A. Helmbold, D. Meissner, Thin Solid Films, 1996, 283:196-203.
Lutolf et al., Adv. Mater., 2003, 15(11), 888-892.
Ruiz, Ricardo et al., Science, vol. 321, Aug. 15, 2008, pp. 936-939.
Search Report of the IPO, Taiwanese Application No. 097110156, issued Apr. 10, 2012, two pages.
Truskett, Van N., et al., Trends in Biotechnology, vol. 24, No. 7, Jul. 2006, pp. 312-315.
Zhu et al., Langmuir, 2006, 1b, 6766-6772.
Search Report of Taiwanese Patent Application No. 097121922, dated Oct. 16, 2011, 1 page.
Search Report of Taiwanese Patent Application No. 098108789, dated Dec. 18, 2012, 1 page.
Search Report of Taiwanese Patent Application No. 098109253, dated Aug. 22, 2012, 1 page.
Search Report of Taiwanese Patent Application No. 097110156, dated Mar. 22, 2012, 1 page.
Electronegativity—<http://www.princeton.edu/~achaney/tmve/wiki100k/docs/Electronegativity.html> website, visited Aug. 28, 2013, 1 page.
Asakawa et al., Fabrication of Subwavelength Structure for Improvement in Light-Extraction Efficiency of Light-Emitting Devices Using a Self-Assembled Pattern of Block Copolymer, Applied Optics, vol. 44, No. 34, (Dec. 1, 2005), pp. 7475-7482.
Black et al., Integration of Self-Assembled Diblock Copolymers for Semiconductor Capacitor Fabrication, Applied Physics Letters, vol. 79, No. 3, (2001), pp. 409-411, Jul. 16, 2001.
Chai et al., Assembly of Aligned Linear Metallic Patterns on Silicon, Nature Nanotechnology, vol. 2, (Aug. 2007), pp. 500-506.
Chai et al., Using Cylindrical Domains of Block Copolymers to Self-Assemble and Align Metallic Nanowires, American Chemical Society, www.acsnano.org, (2008), pp. A-M, published online Feb. 5, 2008.
Chen et al., Highly Ordered Arrays of Mesoporous Silica Nanorods with Tunable Aspect Ratios from Block Copolymer Thin Films, Advanced Materials, vol. 20, (2008), pp. 763-767.
Cho et al., Nanoporous Block Copolymer Micelle/Micelle Multilayer Films with Dual Optical Properties, J. Am. Chem. Soc., vol. 128, No. 30, (2006), pp. 9935-9942, published on web Jul. 12, 2006.
Clark et al., Selective Deposition in Multilayer Assembly: SAMs as Molecular Templates, Supramolecular Science, vol. 4, (1997), pp. 141-146.
Erlandsson et al., Metallic Zinc Reduction of Disulfide Bonds Between Cysteine Residues in Peptides and Proteins, Int'l J. Peptide Res. & Therapeutics, vol. 11, No. 4, (Dec. 2005), pp. 261-265.
Fasolka et al., Block Copolymer Thin Films: Physics and Applications, Annual Reviews Materials Res., vol. 31, (Aug. 2001), pp. 323-355.
Gates, Nanofabrication with Molds & Stamps, Materials Today, (Feb. 2005), pp. 44-49.
Grubbs, Hybrid Metal-Polymer Composites from Functional Block Copolymers, J. of Polymer Sci.: Part A: Polymer Chemistry, vol. 43, Issue 19, (Oct. 1, 2005), pp. 4323-4336.
Guarini et al., Nanoscale Patterning Using Self-Assembled Polymers for Semiconductor Applications, J. Vac. Sci. Technol. B 19(6), (Nov./Dec. 2001), pp. 2784-2788.
Hadziioannou, Semiconducting Block Copolymers for Self-Assembled Photovoltaic Devices, MRS Bulletin, (Jun. 2002), pp. 456-460.
Hamers, Passivation and Activation: How Do Monovalent Atoms Modify the Reactivity of Silicon Surfaces? A Perspective on the Article, "The Mechanism of Amine Formation on Si(100) Activated with Chlorine Atoms," by C.C. Fustad, A.D. Thorsness, and A.J. Muscat, Surface Sci., vol. 600, (2006), pp. 3361-3362, available online Jun. 9, 2006.
Hayward et al., Crosslinked Poly(styrene)-block-Poly(2-vinylpyridine) Thin Films as Swellable Templates for Mesostructured Silica and Titania, Advanced Materials, vol. 17, (2005), pp. 2591-2595, published online Sep. 15, 2005.
Helmuth et al., High-Speed Microcontact Printing, J. Am. Chem. Soc., vol. 128, No. 29, (2006), pp. 9296-9297, published on Web Jun. 29, 2006.
Horiuchi et al., Three-Dimensional Nanoscale Alignment of Metal Nanoparticles Using Block Copolymer Films as Nanoreactors, Langmuir, vol. 19, (2003), pp. 2963-2973, published on Web Feb. 28, 2003.

(56) References Cited

OTHER PUBLICATIONS

Huang et al., Stretchable Gold Conductors on Elastomeric Substrates, Applied Physics Letters, vol. 82, No. 15, (Apr. 14, 2003), pp. 2404-2406.
Huang et al., Using Surface Active Random Copolymers to Control the Domain Orientation in Diblock Copolymer Thin Films, Macromolecules, vol. 31, (1998), pp. 7641-7650, published on Web Oct. 10, 1998.
Hur et al., Nanotransfer Printing by Use of Noncovalent Surface Forces: Applications to Thin-Film Transistors That Use Single-Walled Carbon Nanotube Networks and Semiconducting Polymers, Applied Physics Letters, vol. 85, No. 23, (Dec. 6, 2004), pp. 5730-5732.
Jiang et al., Electrochemical Desorption of Self-Assembled Monolayers Noninvasively Releases Patterned Cells from Geometrical Confinements, J. Am. Chem. Soc., vol. 125, No. 9, (2003), pp. 2366-2367, published on Web Feb. 6, 2003.
Johnson et al., Probing the Stability of the Disulfide Radical Intermediate of Thioredoxin Using Direct Electrochemistry, Letters in Peptide Sci., vol. 10, (2003), pp. 495-500.
Jun et al., Patterning Protein Molecules on Poly(ethylene glycol) Coated Si(111), Biomaterials, vol. 25, (2004), pp. 3503-3509.
Kavakli et al., Single and Double-Layer Antireflection Coatings on Silicon, Turk J. Phys., vol. 26, (2002), pp. 349-354.
Krishnamoorthy et al., Block Copolymer Micelles as Switchable Templates for Nanofabrication, Languir, vol. 22, No. 8, (2006), pp. 3450-3452, published on web Mar. 17, 2006.
Krishnamoorthy et al., Nanopatterned Self-Assembled Monolayers by Using Diblock Copolymer Micelles as Nanometer-Scale Adsorption and Etch Masks, Advanced Materials, (2008), pp. 1-4.
Kuhnline et al., Detecting Thiols in a Microchip Device Using Micromolded Carbon Ink Electrodes Modified with Cobalt Phthalocyanine, Analyst, vol. 131, (2006), pp. 202-207.
Li et al., A Method for Patterning Multiple Types of Cells by Using Electrochemical Desorption of Self-Assembled Monolayers within Microfluidic Channels, Angew. Chem. Int. Ed., vol. 46, (2007), pp. 1094-1096, published online Dec. 21, 2006.
Liu et al., Pattern Transfer Using Poly(styrene-block-methyl methacrylate) Copolymer Films and Reactive Ion Etching, J. Vac. Sci. Technol. B, vol. 25, No. 6, (Nov./Dec. 2007), pp. 1963-1968.
Loo et al., Additive, Nanoscale Patterning of Metal Films with a Stamp and a Surface Chemistry Mediated Transfer Process: Applications in Plastic Electronics, Applied Physics Letters, vol. 81, No. 3, (Jul. 15, 2002), pp. 562-564.
Lopes et al., Hierarchical Self-Assembly of Metal Nanostructures on Diblock Copolymer Scaffolds, Nature, vol. 414, (Dec. 13, 2001), pp. 735-738.
Lutz, 1,3-Dipolar Cycloadditions of Azides and Alkynes: A Universal Ligation Tool in Polymer and Materials Science, Angew. Chem. Int. Ed., vol. 46, (2007), pp. 1018-1025.
Malenfant et al., Self-Assembly of an Organic-Inorganic Block Copolymer for Nano-Ordered Ceramics, Nature Nanotechnology, vol. 2, (Jan. 2007) pp. 43-46.
Mindel et al., A Study of Bredig Platinum Sols, The Chemical Laboratories of New York University, 1943, vol. 65 pp. 2112.
Niu et al., Selective Assembly of Nanoparticles on Block Copolymer by Surface Modification, Nanotechnology, vol. 18, (2007), pp. 1-4, published online Feb. 21, 2007.
Park et al., Fabrication of Highly Ordered Silicon Oxide Dots and Stripes from Block Copolymer Thin Films, Advanced Materials, vol. 20, (2008), pp. 681-685, Published online Jan. 29, 2008.
Park et al., High-Aspect-Ratio Cylindrical Nanopore Arrays and Their Use for Templating Titania Nanoposts, Advanced Materials, vol. 20, (2008), pp. 738-742, Published online Jan. 29, 2008.
Reed et al., Molecular Random Access Memory Cell, Appl. Phys. Lett., vol. 78, No. 23, (Jun. 4, 2001), pp. 3735-3737.
Kim et al., Epitaxial self-assembly of block copolymers on lithographically defined nanopatterned substrates, Nature, vol. 24, Jul. 2003, pp. 411-414.
Sato et al., Novel Antireflective Layer Using Polysilane for Deep Ultraviolet Lithography, J. Vac. Sci. Technol. B, vol. 17, No. 6, (Nov./Dec. 1999), pp. 3398-3401.
Sohn et al., Fabrication of the Multilayered Nanostructure of Alternating Polymers and Gold Nanoparticles with Thin Films of Self-Assembling Diblock Copolymers, Chem. Mater., vol. 13, (2001), pp. 1752-1757, Published on Web Apr. 28, 2001.
Tadd et al, Spatial Distribution of Cobalt Nanoclusters in Block Copolymers, Langmuir, vol. 18, (2002), pp. 2378-2384, Published on Web Feb. 8, 2002.
Tang et al., Evolution of Block Copolymer Lithography to Highly Ordered Square Arrays, Science, vol. 322, No. 5900, (Sep. 25, 2008), pp. 429-432.
Trimbach et al., Block Copolymer Thermoplastic Elastomers for Microcontact Printing, Langmuir, vol. 19, (2003), pp. 10957-10961, Published on Web Nov. 14, 2003.
Tseng et al., Enhanced Block Copolymer Lithography Using Sequential Infiltration Synthesis, J. of Physical Chemistry, (Jul. 11, 2011), 16 pgs.
Xia et al., An Approach to Lithographically Defined Self-Assembled Nanoparticle Films, Advanced Materials, vol. 18, (2006), pp. 930-931.
Xia et al., Soft Lithography, Annu. Rev. Mater. Sci., vol. 28, (1998), pp. 153-184.
Xu et al., Electric Field Alignment of Symmetric Diblock Copolymer Thin Films, Macromolecules, (2003), 5 pgs.
Xu et al., Interfacial Interaction Dependence of Microdomain Orientation in Diblock Copolymer Thin Films, Macromolecules, vol. 38, (2005), pp. 2802-2805, Published on Web Mar. 10, 2005.
Xu et al., Surface-Initiated Atom Transfer Radical Polymerization from Halogen-Terminated Si(111) (Si—X, X = Cl, Br) Surfaces for the Preparation of Well-Defined Polymer—Si Hybrids, Langmuir, vol. 21, No. 8 (2005), pp. 3221-3225, Published on Web Mar. 8, 2005.
Yang et al., Covalently Attached Graft Polymer Monolayer on Organic Polymeric Substrate via Confined Surface Inhibition Reaction, J. Polymer Sci.—A—Polymer Chemistry Ed., vol. 45, Issue 5, (2007), pp. 745-755.
Yu et al., Contact Printing Beyond Surface Roughness: Liquid Supramolecular Nanostamping, Advanced Materials, vol. 19, (2007), pp. 4338-4342, Published online Nov. 21, 2007.
Zaumseil et al., Three-Dimensional and Multilayer Nanostructures Formed by Nanotransfer Printing, Nano Letters, vol. 3, No. 9, (2003) pp. 1223-1227, Published on Web Jul. 31, 2003.
Zhang et al., Self-Assembled Monolayers of Terminal Alkynes on Gold, J. Am. Chem. Soc., vol. 129, No. 16, (2007), pp. 4876-4877, Published on Web Mar. 31, 2007.

\* cited by examiner

FIG. 1
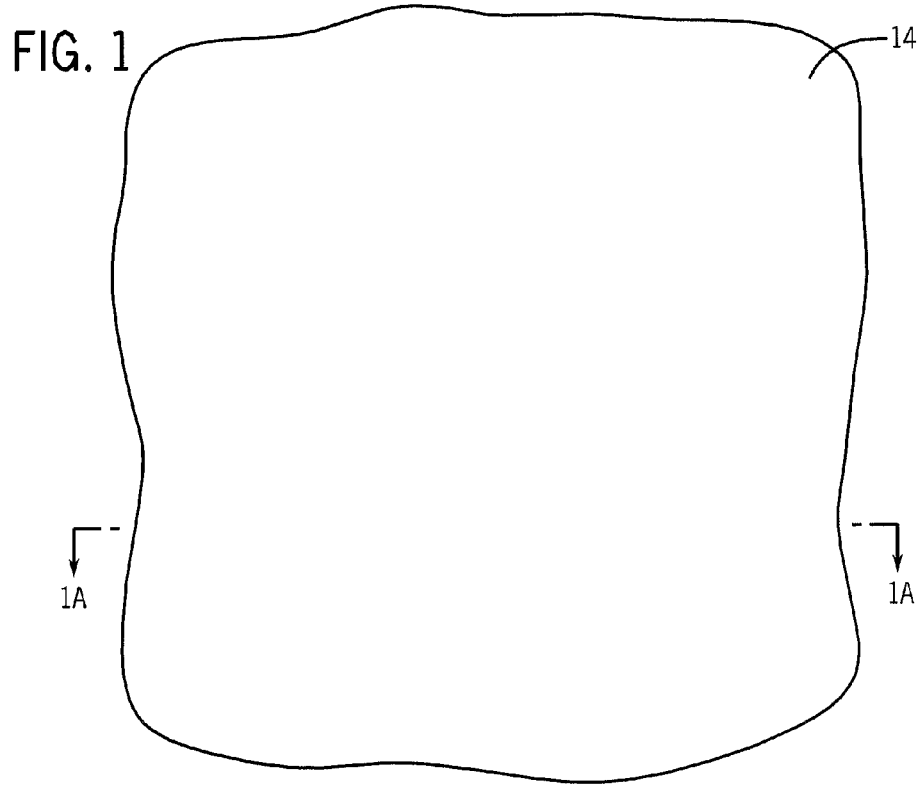
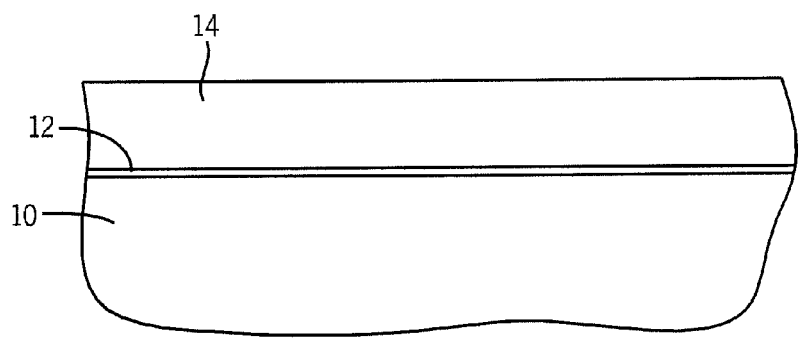
FIG. 1A

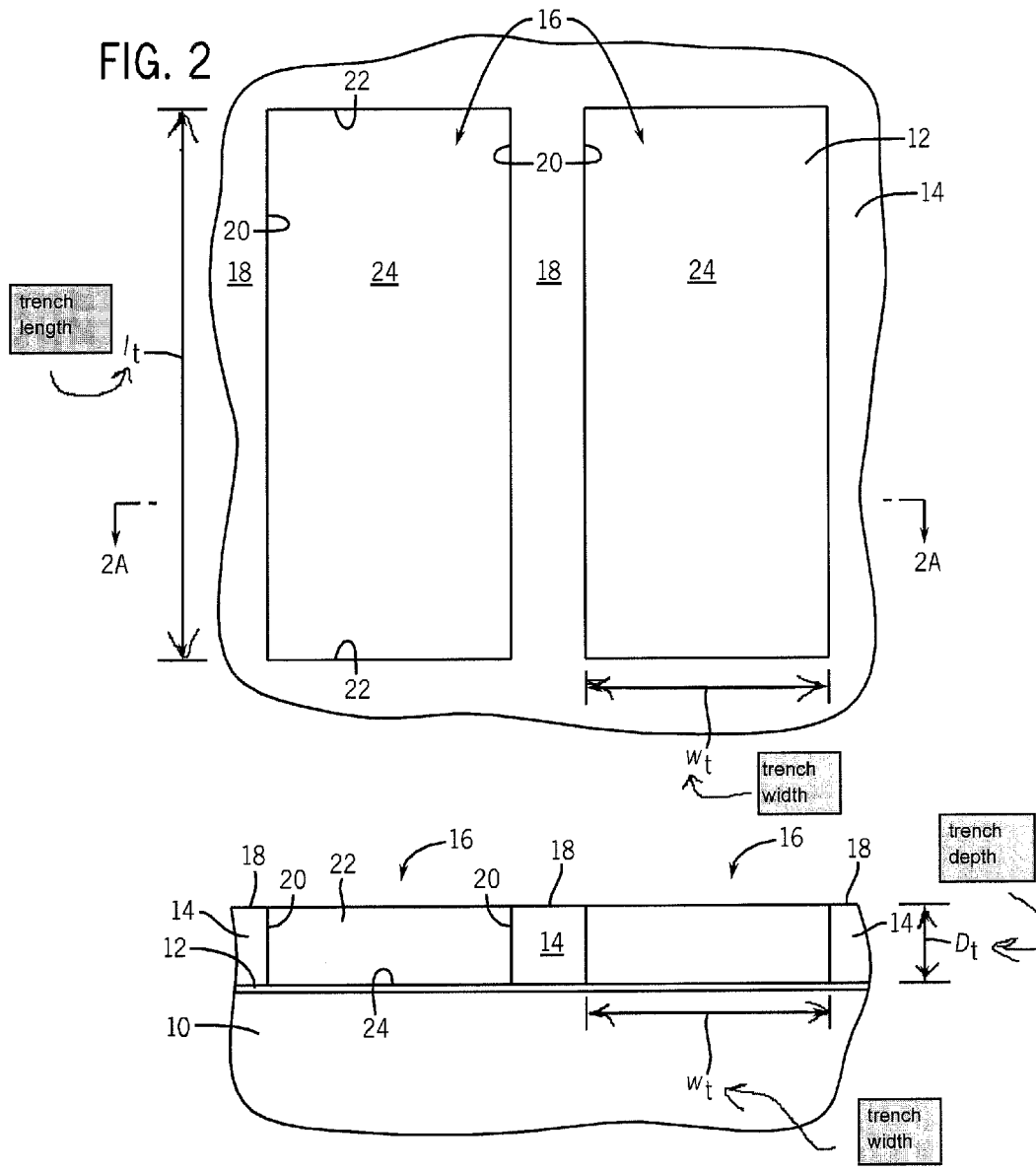

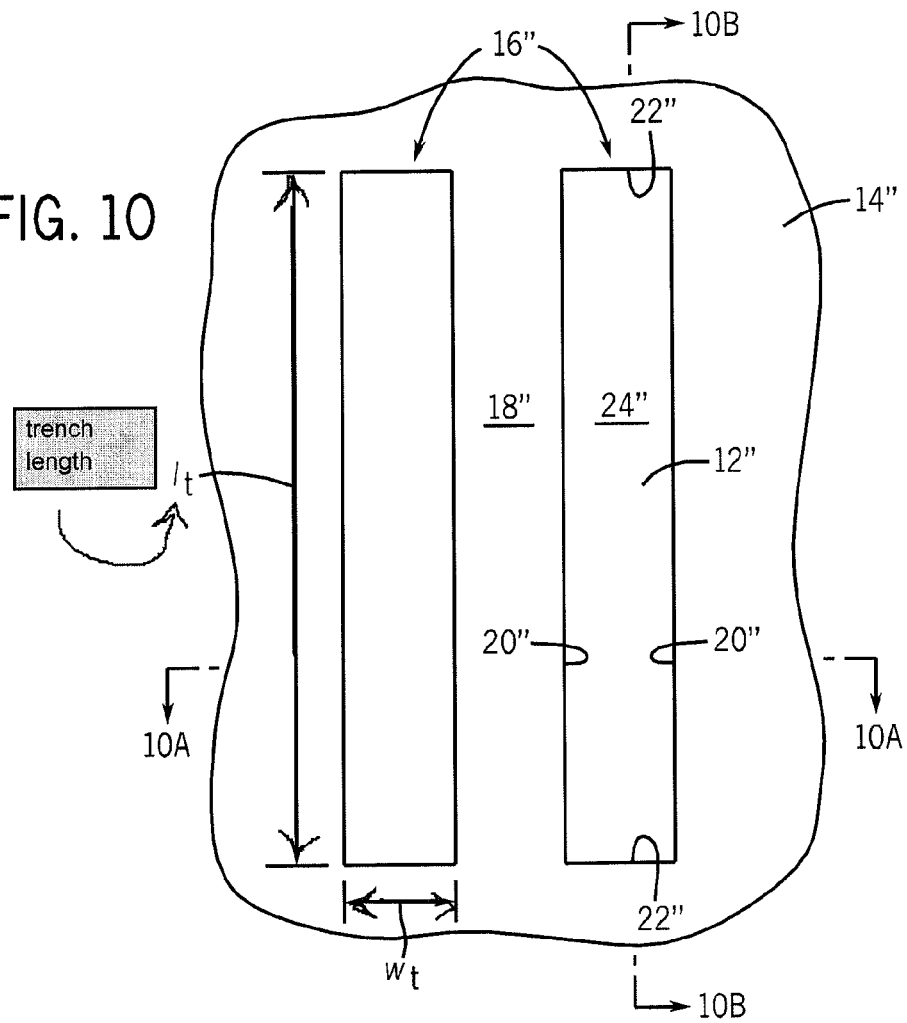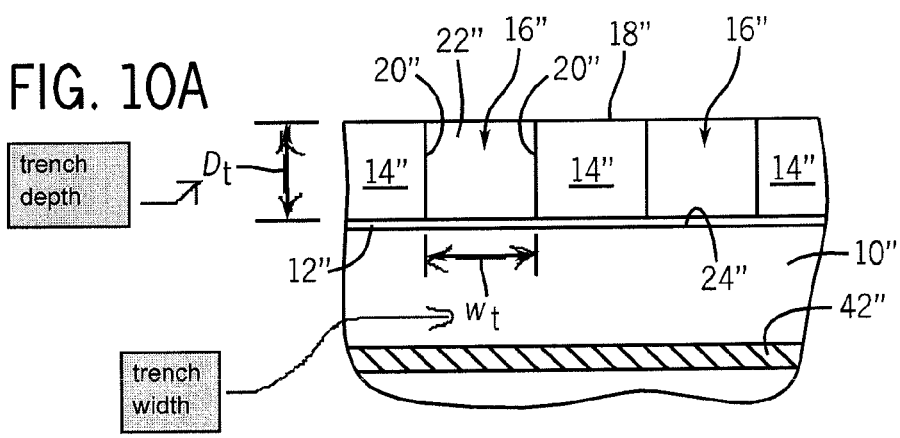

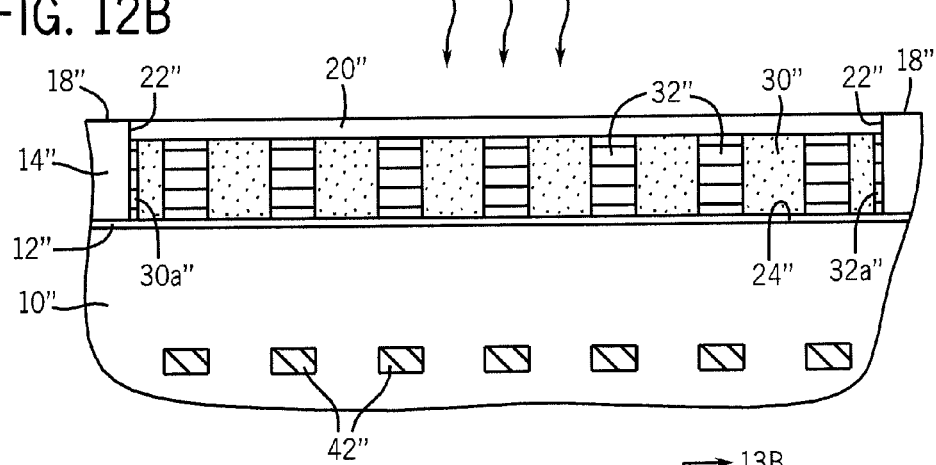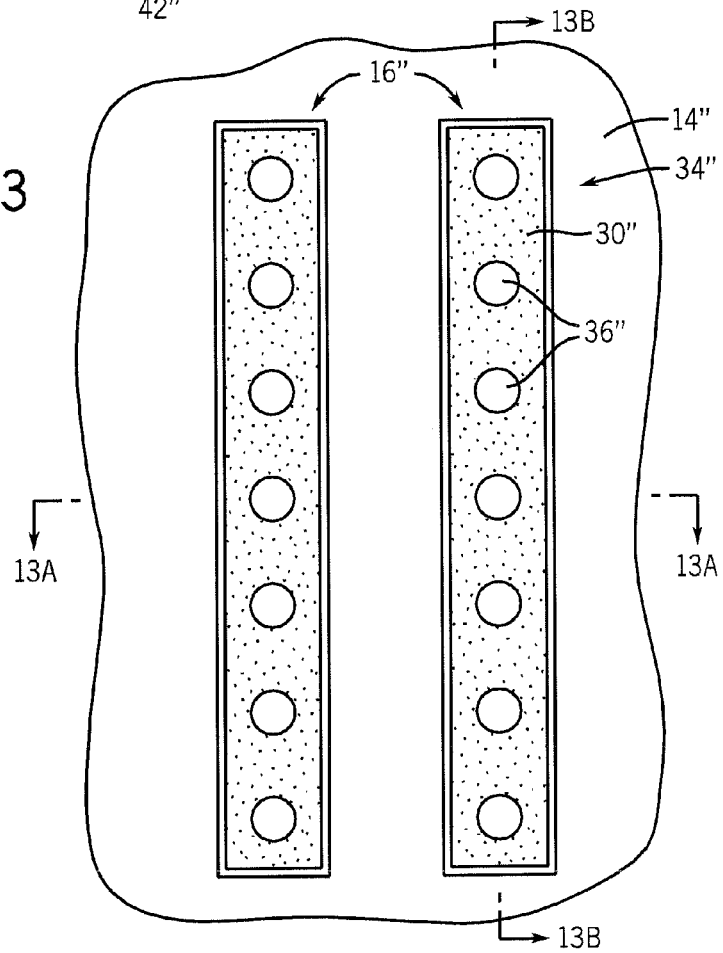

FIG. 14
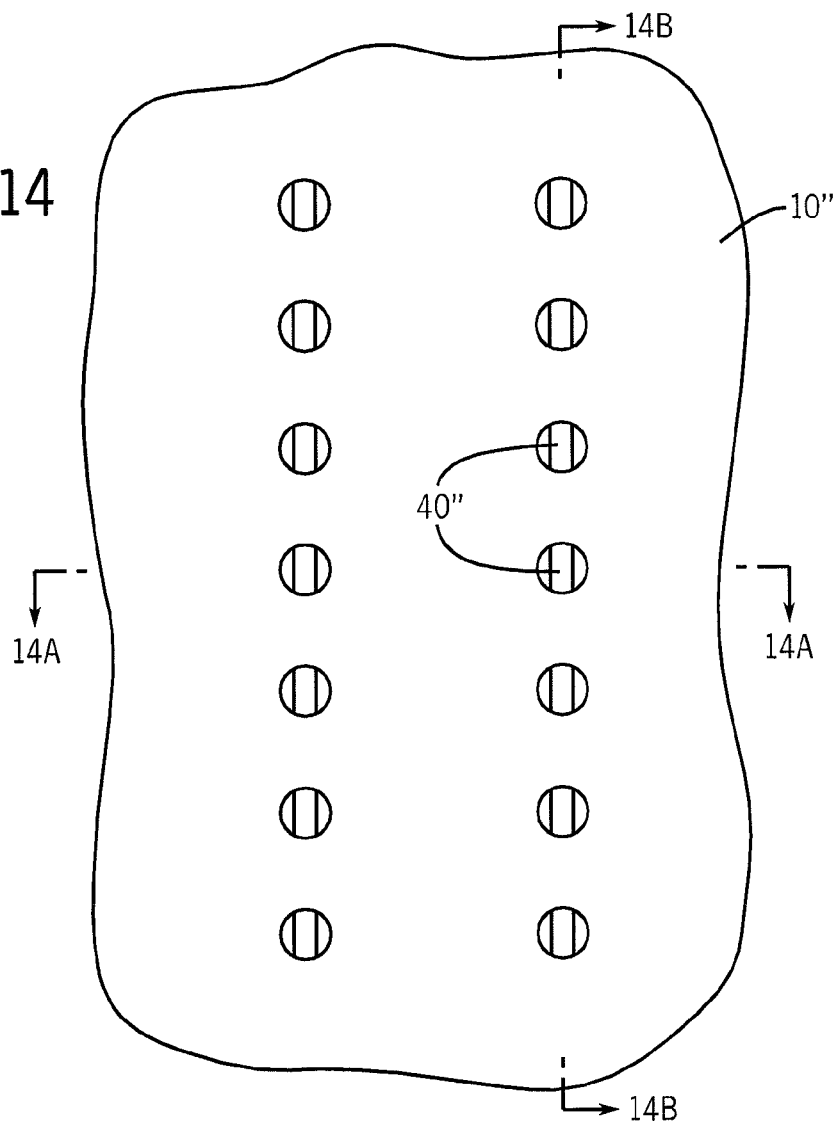
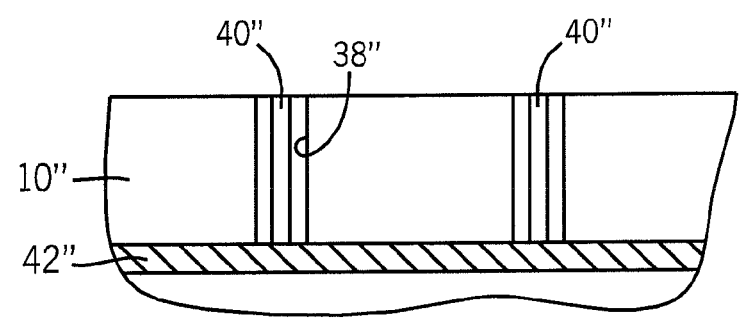
FIG. 14A

METHODS OF IMPROVING LONG RANGE ORDER IN SELF-ASSEMBLY OF BLOCK COPOLYMER FILMS WITH IONIC LIQUIDS

CROSS-REFERENCE TO RELATED APPLICATION

This application is a divisional of U.S. Ser. No. 12/053,006, filed Mar. 21, 2008, now U.S. Pat. No. 8,425,982.

TECHNICAL FIELD

Embodiments of the invention relate to methods of fabricating thin films of self-assembling block copolymers, and devices resulting from those methods.

BACKGROUND OF THE INVENTION

As the development of nanoscale mechanical, electrical, chemical and biological devices and systems increases, new processes and materials are needed to fabricate nanoscale devices and components. Making electrical contacts to conductive lines has become a significant challenge as the dimensions of semiconductor features shrink to sizes that are not easily accessible by conventional lithography. Optical lithographic processing methods have difficulty fabricating structures and features at the sub-60 nanometer level. The use of self-assembling diblock copolymers presents another route to patterning at nanoscale dimensions. Diblock copolymer films spontaneously assemble into periodic structures by microphase separation of the constituent polymer blocks after annealing, for example by thermal annealing above the glass transition temperature of the polymer or by solvent annealing, forming ordered domains at nanometer-scale dimensions.

The film morphology, including the size and shape of the microphase-separated domains, can be controlled by the molecular weight and volume fraction of the AB blocks of a diblock copolymer to produce lamellar, cylindrical, or spherical morphologies, among others. For example, for volume fractions at ratios greater than about 80:20 of the two blocks (AB) of a diblock polymer, a block copolymer film will microphase separate and self-assemble into a periodic spherical domains with spheres of polymer B surrounded by a matrix of polymer A. For ratios of the two blocks between about 60:40 and 80:20, the diblock copolymer assembles into a periodic hexagonal close-packed or honeycomb array of cylinders of polymer B within a matrix of polymer A. For ratios between about 50:50 and 60:40, lamellar domains or alternating stripes of the blocks are formed. Domain size typically ranges from 5-50 nm.

Attempts have been made to control orientation and long range ordering of self-assembling block copolymer materials. Salts such as sodium and potassium chloride (NaCl, KCl) have been shown to improve long range ordering of block copolymer material on substrates. However, the sodium (Na) and potassium (K) are highly mobile, which can result in contamination of other device structures during processing. Other researches have added organic surfactants to diblock copolymers to improve long range ordering during self-assembly. However, during the high temperature/vacuum anneal of the block copolymer material, the organic surfactant evaporates from the film before the self-assembly process is completed, limiting the annealing conditions that can be used.

It would be useful to provide methods of fabricating films of ordered nanostructures that overcome these problems and provide enhanced long range ordering of the self-assembling polymer domains.

BRIEF DESCRIPTION OF THE DRAWINGS

Embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIG. 1 illustrates a diagrammatic top plan view of a portion of a substrate at a preliminary processing stage according to an embodiment of the present disclosure, showing the substrate with a neutral wetting material thereon. FIG. 1A is an elevational, cross-sectional view of the substrate depicted in FIG. 1 taken along line 1A-1A.

FIG. 2 illustrates a top plan view of the substrate of FIG. 1 at a subsequent stage showing the formation of trenches in a material layer formed on the neutral wetting material. FIG. 2A illustrates an elevational, cross-sectional view of a portion of the substrate depicted in FIG. 2 taken along line 2A-2A.

FIGS. 5A-6A illustrate elevational, cross-sectional views of a portion of the substrate depicted in FIGS. 5 and 6 taken along lines 5A-5A and 6A-6A, respectively.

FIG. 10 is a diagrammatic top plan view of a portion of a substrate at a preliminary processing stage according to another embodiment of the disclosure, showing trenches in a material layer exposing the substrate. FIGS. 10A and 10B are elevational, cross-sectional views of the substrate depicted in FIG. 10 taken along lines 10A-10A and 10B-10B, respectively.

FIGS. 11B and 12B are cross-sectional views of the substrate depicted in FIGS. 11 and 12 taken along lines 11B-11B and 12B-12B, respectively.

FIGS. 13 and 14 are top plan views of the substrate of FIG. 12 at subsequent stages, illustrating an embodiment of the use of the self-assembled block copolymer film after removal of one of the cylindrical domains, as a mask to etch the substrate and filling of the etched openings. FIGS. 13A and 14A illustrate elevational, cross-sectional views of a portion of the substrate depicted in FIGS. 13 and 14 taken along lines 13A-13A to 14A-14A, respectively.

DETAILED DESCRIPTION OF THE INVENTION

Figure 3:
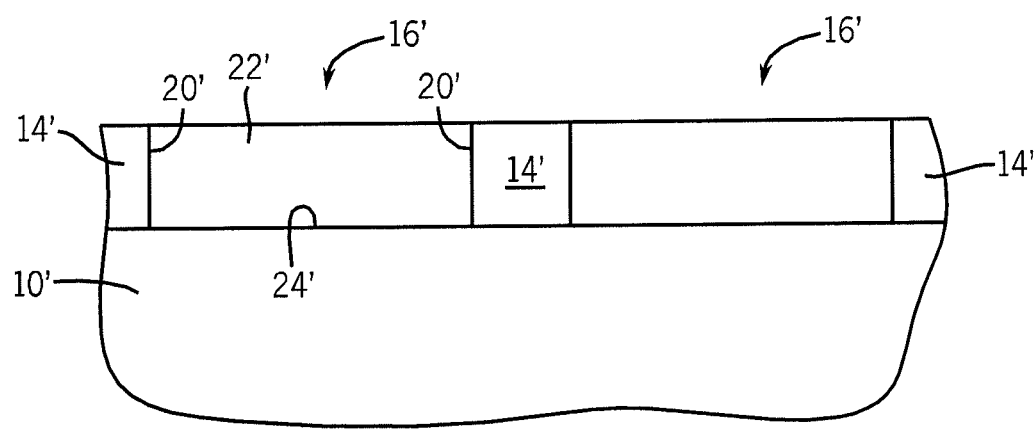
FIG. 3 illustrates a side elevational view of a portion of a substrate at a preliminary processing stage according to another embodiment of the disclosure, showing the substrate with trenches in a material layer formed on the substrate.

The following description with reference to the drawings provides illustrative examples of devices and methods according to embodiments of the invention. Such description is for illustrative purposes only and not for purposes of limiting the same.

In the context of the current application, the term "semiconductor substrate" or "semiconductive substrate" or "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

"$L_o$" as used herein is the inherent periodicity or pitch value (bulk period or repeat unit) of structures that self-assemble upon annealing from a self-assembling (SA) block copolymer. "$L_B$" as used herein is the periodicity or pitch value of a blend of a block copolymer with one or more of its constituent homopolymers. "L" is used herein to indicate the center-to-center cylinder pitch or spacing of cylinders of the block copolymer or blend, and is equivalent to "$L_o$" for a pure block copolymer and "$L_B$" for a copolymer blend.

In embodiments of the invention, a polymer material (e.g., film, layer) is prepared by guided self-assembly of block copolymers, with both polymer domains at the air interface. Block copolymer materials spontaneously assemble into periodic structures by microphase separation of the constituent polymer blocks after annealing, forming ordered domains at nanometer-scale dimensions. In embodiments of the invention, an ordered linear array pattern registered to the trench sidewalls is formed within a trench from a lamellar-phase block copolymer material. In other embodiments of the invention, a one-dimensional (1-D) array of perpendicular-oriented cylinders is formed within a trench from a cylindrical-phase block copolymer material.

Embodiments of the invention pertain to the improved long range order imparted by addition of an appropriate ionic liquid to the block copolymer material, such ionic liquid selected to perform one or more functions in the block copolymer blend, for example, a surfactant/plasticizer effect and a phase-selective complexation role.

Following self-assembly, the pattern of perpendicular-oriented lamellae or cylinders that is formed on the substrate can then be used, for example, to form an etch mask for patterning nanosized features into the underlying substrate through selective removal of one block of the self-assembled block copolymer. Since the domain sizes and periods (L) involved in this method are determined by the chain length of a block copolymer (MW), resolution can exceed other techniques such as conventional photolithography. Processing costs using the technique are significantly less than extreme ultraviolet (EUV) photolithography, which has comparable resolution.

A method for fabricating a self-assembled block copolymer material that defines an array of nanometer-scale, perpendicular-oriented lamellae according to an embodiment of the invention is illustrated with reference to FIGS. 1-6.

The described embodiment involves an anneal of a lamellar-phase block copolymer material formulated with an ionic liquid in combination with a graphoepitaxy technique that utilizes a lithographically defined trench as a guide with a floor composed of a material that is neutral wetting to both polymer blocks and sidewalls and ends that are preferential wetting to one polymer block and function as constraints to induce self-assembly of the block copolymer material. Upon annealing, the block copolymer material will self-assemble into rows or lines of lamellae oriented perpendicular to the trench floor and registered to the sidewalls.

As depicted in FIGS. 1 and 1A, a substrate 10 is provided, which can be, for example, silicon, silicon oxide, silicon nitride, silicon oxynitride, silicon oxycarbide, among other materials.

In the illustrated embodiment, a neutral wetting material 12 (e.g., random copolymer) has been formed over the substrate 10. A material layer 14 (or one or more material layers) can then be formed over the neutral wetting material and etched to form trenches 16 as shown in FIGS. 2 and 2A. Portions of the material layer 14 form a mesa or spacer 18 outside and between the trenches. The trenches 16 are structured with opposing sidewalls 20, opposing ends 22, a floor 24, a width ($w_t$), a length ($l_t$) and a depth ($D_t$).

Figure 4:
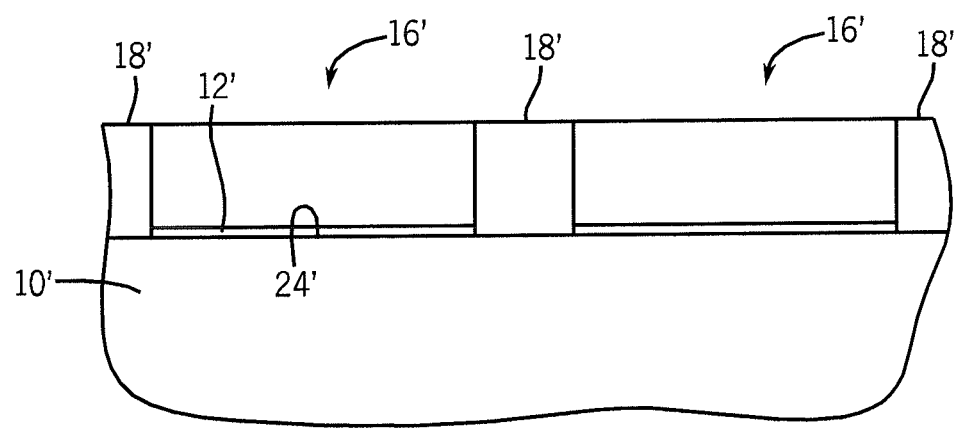
FIG. 4 illustrates a side elevational view of the substrate of FIG. 3 at a subsequent stage showing the formation of a neutral wetting material within the trenches.

In another embodiment illustrated in FIGS. 3 and 4, the material layer 14' can be formed on the substrate 10', etched to fauu the trenches 16', and a neutral wetting material 12' can then be formed on the trench floors 24'. For example, a random copolymer material can be deposited into the trenches and crosslinked to form a neutral wetting material layer. Material on surfaces outside the trenches such as on the spacers 18' (e.g., non-crosslinked random copolymer) can be subsequently removed.

Single or multiple trenches 16 (as shown) can be formed in the material layer 14 using a lithographic tool having an exposure system capable of patterning at the scale of L (e.g., about 10-100 nm). Such exposure systems include, for example, extreme ultraviolet (EUV) lithography, proximity X-rays and electron beam (e-beam) lithography, as known and used in the art. Conventional photolithography can attain (at smallest) about 58 nm features.

A method called "pitch doubling" or "pitch multiplication" can also be used for extending the capabilities of photolithographic techniques beyond their minimum pitch, as described, for example, in U.S. Pat. No. 5,328,810 (Lowrey et al.), U.S. Pat. No. 7,115,525 (Abatchev, et al.), US 2006/0281266 (Wells) and US 2007/0023805 (Wells). Briefly, a pattern of lines is photolithographically formed in a photoresist material overlying a layer of an expendable material, which in turn overlies a substrate, the expendable material layer is etched to form placeholders or mandrels, the photoresist is stripped, spacers are formed on the sides of the mandrels, and the mandrels are then removed leaving behind the spacers as a mask for patterning the substrate. Thus, where the initial photolithography formed a pattern defining one feature and one space, the same width now defines two features and two spaces, with the spaces defined by the spacers. As a result, the smallest feature size possible with a photolithographic technique is effectively decreased down to about 30 nm or less.

Generally, the trench sidewalls, edges and floors influence the structuring of the array of nanostructures within the trenches. Factors in forming a single line or multiple lines of perpendicular-oriented lamellae within the trenches include the width ($w_t$) of the trench, the formulation of the block copolymer or blend to achieve the desired pitch (L), and the thickness (t) of the block copolymer material within the trench at the time of the anneal. The boundary conditions of the trench sidewalls in both the x- and y-axis impose a structure wherein each trench contains n number of lamellae.

In the present embodiment, the width ($w_t$) of the trench can be varied according to the desired number of rows of perpendicular-oriented lamellae (e.g., n lines of lamellae). The width ($w_t$) of the trenches is generally a multiple of the inherent pitch value (L) of the block copolymer material being equal to or about n*L, typically ranging from about n*10 to about n*100 nm (with n being the number of features or structures, e.g., lamellae).

In the illustrated embodiment, the trenches 16 are constructed with a width ($w_t$) that is greater than the L or pitch value of the block copolymer (or blend) such that the lamellar-phase block copolymer material will self-assemble upon annealing to form a single layer of multiple rows of lamellae spanning the width ($w_t$) of the trench and registered to the sidewalls for the length of the trench, with a repeat spacing of domains (e.g., PMMA lamellae) having a center-to-center pitch distance (p) at about the L value. The length ($l_t$) of the trenches 16 is according to the desired length of the lines of the lamellae. The width of the mesas or spacers 18 between adjacent trenches can vary and is generally about L to about n*L. In some embodiments, the trench dimension is about 50-3,500 nm wide ($w_t$) and about 100-25,000 nm in length ($l_t$), with a depth ($D_t$) of about 10-500 nm.

In the described embodiment, the trench floors 24 are structured to be neutral wetting (equal affinity) for both blocks of the block copolymer to induce formation of lamellar polymer domains that are oriented perpendicular to the trench floors, and the trench sidewalls 20 and ends 22 are structured to be preferential wetting by one block of the block copolymer to induce a parallel alignment and registration of the lamellae to the sidewalls as the polymer blocks self-assemble.

To provide preferential wetting sidewalls and ends, the material layer 14 can be formed from a material that is inherently preferential wetting to the minority (preferred) polymer block (e.g., PMMA of a PS-b-PMMA material) or, in other embodiments, a preferential wetting material can be selectively applied onto the sidewalls of the trenches 16. For example, the material layer 14 can be composed of an inherently preferential wetting material such as a clean silicon surface (with native oxide), oxide (e.g., silicon oxide, $SiO_x$), silicon nitride, silicon oxycarbide, indium tin oxide (ITO), silicon oxynitride, and resist materials such as methacrylate-based resists and polydimethyl glutarimide resists, among other materials. Such materials exhibit preferential wetting toward PMMA or PVP, among others.

In other embodiments utilizing PS-b-PMMA, a preferential wetting material such as a polymethylmethacrylate (PMMA) polymer modified with an —OH containing moiety (e.g., hydroxyethylmethacrylate) can be selectively applied onto the sidewalls of the trenches in embodiments where a neutral wetting material 12 is in place on the trench floor 24 as in FIG. 2A and FIG. 4). If not, as in FIG. 3, the substrate 10' at the trench floor 24' can be composed of a material that is unreactive with the OH-modified PMMA. An OH-modified PMMA can be applied, for example, by spin coating and then heating (e.g., to about 170° C.) to allow the terminal OH groups to end-graft to oxide sidewalls 20 and ends 22 of the trenches. Non-grafted material can be removed by rinsing with an appropriate solvent (e.g., toluene). See, for example, Mansky et al., *Science*, 1997, 275, 1458-1460, and In et al., *Langmuir*, 2006, 22, 7855-7860.

A chemically neutral wetting trench floor 24 allows both blocks of the block copolymer material to wet the floor of the trench and provides for the formation of a perpendicular-oriented lamellar layout. A neutral wetting material 12 can be provided by applying a neutral wetting polymer (e.g., a neutral wetting random copolymer) onto the substrate 10, then forming an overlying material layer 14 and etching the trenches 16 to expose the underlying neutral wetting material, as illustrated in FIGS. 2 and 2A.

In another embodiment illustrated in FIGS. 3 and 4, a neutral wetting material can be applied after forming the trenches 16', for example, as a blanket coat by casting or spin-coating into the trenches, as depicted in FIG. 4. For example, a random copolymer material can be applied and then thermally processed to flow the material into the bottom of the trenches by capillary action, which results in a layer (mat) composed of the crosslinked, neutral wetting random copolymer. In another embodiment, a random copolymer material within the trenches can be photo-exposed (e.g., through a mask or reticle) to crosslink the random copolymer within the trenches to form the neutral wetting material 12'. Non-crosslinked random copolymer material outside the trenches (e.g., on the spacers 18') can be subsequently removed.

Neutral wetting surfaces can be specifically prepared by the application of random copolymers composed of monomers identical to those in the block copolymer and tailored such that the mole fraction of each monomer is appropriate to form a neutral wetting surface. For example, in the use of a PS-b-PMMA block copolymer, a neutral wetting material 12 can be formed from a thin film of a photo-crosslinkable random PS-r-PMMA that exhibits non-preferential or neutral wetting toward PS and PMMA, which can be cast onto the substrate 10 (e.g., by spin coating). The random copolymer material can be fixed in place by chemical grafting (on an oxide substrate) or by thermally or photolytically crosslinking (any surface) to form a mat that is neutral wetting to PS and PMMA and insoluble when the block copolymer material is cast onto it, due to the crosslinking.

In embodiments in which the substrate 10 is silicon (with native oxide), another neutral wetting surface for PS-b-PMMA can be provided by hydrogen-terminated silicon. The floors 24 of the trenches 16 can be etched, for example, with a hydrogen plasma, to remove the oxide material and form hydrogen-terminated silicon, which is neutral wetting with equal affinity for both blocks of a block copolymer material. H-terminated silicon can be prepared by a conventional process, for example, by a fluoride ion etch of a silicon substrate (with native oxide present, about 12-15 Å) by exposure to an aqueous solution of hydrogen fluoride (HF) and buffered HF or ammonium fluoride ($NH_4F$), by HF vapor treatment, or by a hydrogen plasma treatment (e.g., atomic hydrogen).

An H-terminated silicon substrate can be further processed by grafting a random copolymer such as PS-r-PMMA, PS-r-PVP, etc., selectively onto the substrate resulting in a neutral wetting surface for the corresponding block copolymer (e.g., PS-b-PMMA, PS-b-PVP, etc.). For example, a neutral wetting layer of PS-r-PMMA random copolymer can be provided by an in situ free radical polymerization of styrene and methyl methacrylate using a di-olefinic linker such as divinyl benzene which links the polymer to an H-terminated silicon surface to produce about a 10-15 nm thick film.

In yet another embodiment, a neutral wetting surface (e.g., PS-b-PMMA and PS-b-PEO) can be provided by grafting a self-assembled monolayer (SAM) of a trichlorosilane-base SAM such as 3-(para-methoxyphenyl)propyltrichorosilane grafted to oxide (e.g., $SiO_2$) as described for example, by D. H. Park, *Nanotechnology* 18 (2007), p. 355304.

A surface that is neutral wetting to PS-b-PMMA can also be prepared by spin coating a blanket layer of a photo- or thermally cross-linkable random copolymer such as a benzocyclobutene- or azidomethylstyrene-functionalized random copolymer of styrene and methyl methacrylate (e.g., poly (styrene-r-benzocyclobutene-r-methyl methacrylate (PS-r-PMMA-r-BCB)). For example, such a random copolymer can comprise about 42% PMMA, about (58-x) % PS and x % (e.g., about 2-3%) of either polybenzocyclobutene or poly (para-azidomethylstyrene). An azidomethylstyrene-functionalized random copolymer can be UV photo-crosslinked (e.g., 1-5 MW/cm^2 exposure for about 15 seconds to about 30 minutes) or thermally crosslinked (e.g., at about 170° C. for about 4 hours) to form a crosslinked polymer mat as a neutral wetting layer. A benzocyclobutene-functionalized random copolymer can be thermally cross-linked (e.g., at about 200° C. for about 4 hours or at about 250° C. for about 10 minutes).

In another embodiment, a neutral wetting random copolymer of polystyrene (PS), polymethacrylate (PMMA) with hydroxyl group(s) (e.g., 2-hydroxyethyl methacrylate (P(S-r-MMA-r-HEMA)) (e.g., about 58% PS) can be selectively grafted to a substrate 10 (e.g., an oxide) as a neutral wetting layer about 5-10 nm thick by heating at about 160° C. for about 48 hours. See, for example, In et al., *Langmuir*, 2006, 22, 7855-7860.

In yet another embodiment, a blend of hydroxyl-terminated homopolymers and a corresponding low molecular weight block copolymer can be grafted (covalently bonded) to the substrate to form a neutral wetting interface layer (e.g., about 4-5 nm) for PS-b-PMMA and PS-b-P2VP, among other block copolymers. The block copolymer can function to emulsify the homopolymer blend before grafting. For example, an about 1 wt-% solution (e.g., in toluene) of a blend of about 20-50 wt-% (or about 30-40 wt-%) OH-terminated homopolymers (e.g., $M_n$=6K) and about 80-50 wt-% (or about 70-60 wt-%) of a low molecular weight block copolymer (e.g., 5K-5K) can be spin coated onto a substrate 10 (e.g., $SiO_2$), heated (baked) (e.g., at 160° C.), and non-grafted (unbonded) polymer material removed, for example by a solvent rinse (e.g., toluene). For example, the neutral wetting material can be prepared from a blend of about 30 wt-% PS—OH ($M_n$=6K) and PMMA-OH ($M_n$=6K) (weight ratio of 4:6) and about 70 wt-% PS-b-PMMA (5K-5K), or a ternary blend of PS—OH (6K), P2VP-OH (6K) and PS-b-2VPP (8K-8K), etc.

Figure 5:
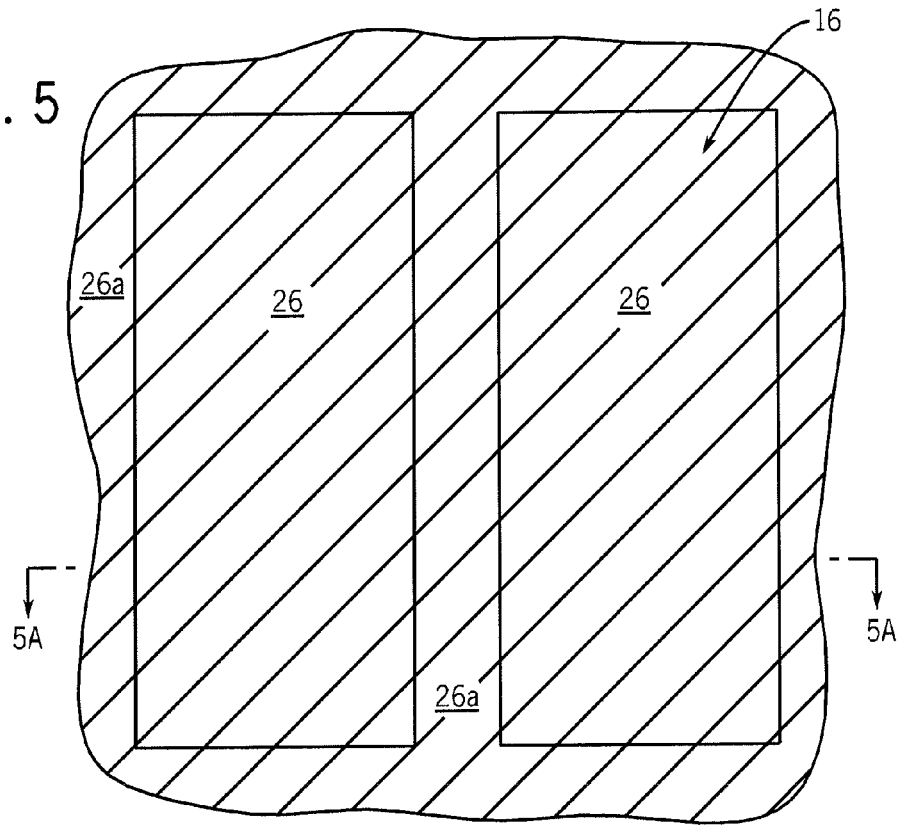
FIGS. 5 and 6 are diagrammatic top plan views of the substrate of FIG. 2 at subsequent stages in the fabrication of a self-assembled block copolymer film according to an embodiment of the disclosure utilizing a lamellar-phase block copolymer material.
Figure 5A:
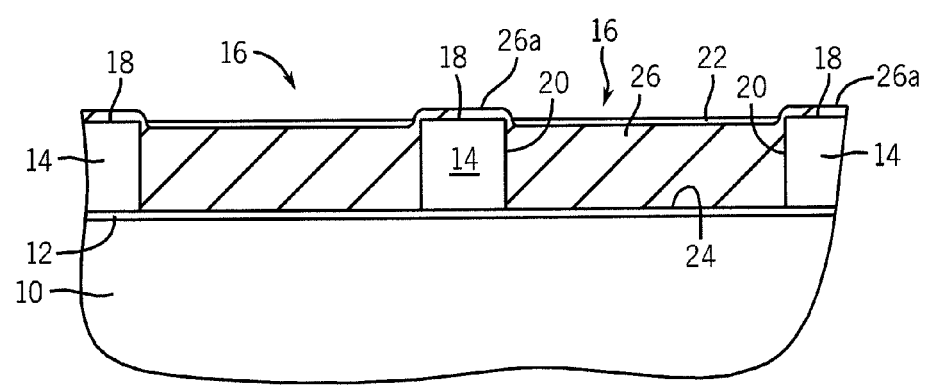

Referring now to FIGS. 5 and 5A, a self-assembling, lamellar-phase block copolymer material 26 having an inherent pitch at or about $L_o$ (or a ternary blend of block copolymer and homopolymers blended to have a pitch at or about $L_B$) is then deposited into the trenches 16, typically as a film. A thin layer 26a of the block copolymer material can be deposited onto the material layer 14 outside the trenches, e.g., on the mesas/spacers 18.

In embodiments of the invention, the block copolymer material is combined with an ionic liquid.

The block copolymer or blend is constructed such that all of the polymer blocks will have equal preference for a chemically neutral wetting material on the trench floor during the anneal. Examples of diblock copolymers include, for example, poly(styrene)-b-poly(methylmethacrylate) (PS-b-PMMA) or other PS-b-poly(acrylate) or PS-b-poly(methacrylate), poly(styrene)-b-poly(vinylpyridine) (PS-b-PVP), poly(styrene)-b-polyethylene oxide) (PS-b-PEO), poly(styrene)-b-poly(lactide) (PS-b-PLA), poly(styrene)-b-poly(tert-butyl acrylate) (PS-b-PtBA), and poly(styrene)-b-polyethylene-co-butylene (PS-b-(PS-co-PB)), poly(isoprene)-b-poly(methylmethacrylate) (PI-b-PMMA), and poly(isoprene)-b-poly(ethyleneoxide) (PI-b-PEO), among others, with PS-b-PMMA used in the illustrated embodiment. One of the polymer blocks of the block copolymer should be selectively and readily removable in order to fabricate an etch mask or template from the annealed film.

Another example of a diblock copolymer that can be utilized is a PS-b-PEO block copolymer having a cleavable junction such as a triphenylmethyl(trityl) ether linkage between PS and PEO blocks which would allow selective removal of the PEO domain under mild conditions. There are literature examples of the complexation of polar groups with potassium or lithium cations, but these elements constitute highly mobile contaminants for semiconductor devices. In some embodiments, a polar ionic liquid such as 1-ethyl-3-methylimidazolium trifluoromethanesulfonate in an effective concentration can be used for effective complexation with donor atoms in the block copolymer such as oxygen in PMMA or PEO, without the use of potential contaminants such as potassium or lithium.

A further example of a diblock copolymer that can be utilized is PS-b-PMMA block copolymer doped with PEO-coated gold nanoparticles of a size less than the diameter of the self-assembled cylinders (Park et al, *Macromolecules*, 2007, 40(11), 8119-8124).

Although diblock copolymers are used in the illustrative embodiment, other types of block copolymers (i.e., triblock or triblock or multiblock copolymers) can be used. Examples of triblock copolymers include ABC copolymers such as poly(styrene-b-methyl methacrylate-b-ethylene oxide) (PS-b-PMMA-b-PEO), and ABA copolymers such as PS-PMMA-PS, PMMA-PS-PMMA, and PS-b-PI-b-PS, among others.

The film morphology, including the domain sizes and periods (L) of the microphase-separated domains, can be controlled by chain length of a block copolymer (molecular weight, MW) and volume fraction of the AB blocks of a diblock copolymer to produce the desired morphology (e.g., cylinders, lamellae, etc.). In embodiments in which a lamellar-forming diblock copolymer is used, the volume fractions of the two blocks (AB) are generally at a ratio between about 50:50 and 60:40 such that the diblock copolymer will microphase separate and self-assemble into alternating lamellar domains of polymer A and polymer B. An example of a lamellae-forming symmetric diblock copolymer is PS-b-PMMA (L~35 nm) with a weight ratio of about 50:50 (PS:PMMA) and total molecular weight ($M_n$) of about 51 kg/mol to form 20 nm wide lamellae (e.g., width of about 0.5*L). To achieve an annealed film in which the lamellae are surface exposed, the Chi value of the polymer blocks (e.g., PS and PMMA) at a common annealing temperature is generally small such that the air interface is equally or non-selectively wetting to both blocks.

The L value of the block copolymer can be modified, for example, by adjusting the molecular weight of the block copolymer. The block copolymer material can also be formulated as a binary or ternary blend comprising a block copolymer and one or more homopolymers (HPs) of the same type of polymers as the polymer blocks in the block copolymer, to produce a blend that will swell the size of the polymer domains and increase the L value. The concentration of homopolymers in the blend can range from 0 to about 60 wt-%. An example of a ternary diblock copolymer blend is a PS-b-PMMA/PS/PMMA blend, for example, 60 wt-% of 46K/21K PS-b-PMMA, 20 wt-% of 20K polystyrene and 20 wt-% of 20K poly(methyl methacrylate). Another example is a blend of 60:20:20 (wt-%) of PS-b-PEO/PS/PEO, or a blend of about 85-90 wt-% PS-b-PEO and up to 10-15 wt-% PEO; it is believed that the added PEO homopolymer may function, at least in part, to lower the surface energy of the PEO domains to that of PS.

The block copolymer material is combined with a compatible ionic liquid (or blend of ionic liquids).

Ionic liquids are generally characterized non-aqueous, molten salt-like compounds that remain liquid below 100° C. and are non-volatile with a negligible to extremely low vapor pressure. A distinguishing characteristic is the low temperature melting point of the compound. The melting point can be below room temperature or at a relatively low elevated temperature (for example 150° C.) making the ionic liquid(s) compatible with polymeric films while in their liquid state. Ionic liquids can be soluble in water, organic solvents, or both. Ionic liquids consist of a cation and an anion, and can be represented by the general formula $B^+A^-$ where $B^+$ is a cation and $A^-$ is an anion.

Embodiments of the invention utilize the intrinsic characteristics of ionic liquids, including liquid state at room temperature, very low volatility and/or a tunable range of solubility characteristics through particular cation/anion pairing, to fabricate films of ordered nanostructures that overcome existing limitations of some currently used additives to provide enhanced long range ordering of self-assembling polymer domains.

In embodiments of the invention, an ionic liquid is utilized that provides a surfactant effect and, as such, is structured to include a nonpolar component (e.g., alkyl chain) and a polar or water-soluble component to interact with both phases of the block copolymer material, similar to a conventional anionic or cationic surfactant. In other embodiments of the invention in which the desired effect is one of complexation of donor atoms in the polar block of a block copolymer, the cation ($B^+$) and anion ($A^-$) of the ionic liquid are based such that the final compound or molecule contains a cation that will complex selectively with a reactive (polar) group of one phase of the block copolymer material, for example, oxygen-containing functional groups of poly(ethylene oxide) (PEO) or poly(methylmethacrylate) (PMMA), or nitrogen-containing functional groups of poly(vinylpyridine) (PVP), for example. In some embodiments, the organic cation can be relatively small to provide increased interaction with the block copolymer material. In some embodiments, the ionic liquid is composed of an organic cation and a relatively smaller organic or inorganic anion.

Additionally, in embodiments of the method, the ionic liquid does not include elements such as sodium, potassium, or lithium, which can be contaminants in semiconductor processing.

Classes of organic cations ($B^+$) include mono-, di- and tri-substituted imidazoliums (e.g., 1-alkyl-3-methyl-imidazolium), pyridiniums (e.g., 1-alkylpyridinium), pyrrolidiniums (e.g., N-methyl-N-alkylpyrrolidinium, N-butyl-N-methylpyrrolidinium, N,N-dimethylpyrrolidinium), phosphoniums (e.g., tetraalkyl phosphonium, quaternary phosphonium), ammoniums (e.g., tetraalkyl ammonium, quaternary ammonium, aromatic ammonium), guanidiniums, uroniums, isouroniums, thiouroniums, and sulfoniums (e.g., ternary sulphonium), among others.

Classes of anions ($A^-$) include formate, sulfates (e.g., alkylsulfates, octylsulfates), sulfonates (e.g., methanesulfonates, trifluoromethanesulfonate, p-toluenesulfonate), amides, imides (e.g., bis(trifluoromethane)sulfonimide), methanes, borates (e.g., tetrafluoroborate, organoborates), phosphates (e.g., alkylphosphate, hexafluorophosphate, tris (pentafluoroethyl)trifluorophosphates or FAPs), glycolates, antimonates, cobalt tetracarbonyl, trifluoroacetate, and decanoate, among others. Although less desirable for semiconductor processes, halogens (e.g., chlorides, bromides, iodides) are another class of anions ($A^-$). In some embodiments, the anion is a non-halogenated organic anion such as formate, an alkylsulfate, an alkylphosphate or glycolate, for example.

Ionic liquids are described, for example, in U.S. Pat. No. 7,252,791 (Wasserscheid et al.), in U.S. Pat. No. 6,998,152 (Uhlenbrock; Micron Technology, Inc.), in U.S. Pat. No. 6,924,341 (Mays et al., UAB Research Foundation), and in U.S. Published Application 2006/0211871 (Dai et al.), among others. Non-limiting examples of ionic liquids include 1-ethyl-3-methyl-imidazolium ethylsulfate (Emim $EtOSO_3$), 1-ethyl-3-methyl-imidazolium bis(trifluoromethylsulfonyl) imide ([Emim][TFSI]), 1-ethyl-3-methyl-imidazolium tetrafluoroborate ([Emim][$BF_4$]), 1-butyl-3-methyl-imidazolium tetrafluoroborate ([Bmim][$BF_4$]), 1-butyl-3-methyl-imidazolium hexafluorophosphate ([Bmim][$PF_6$]), 1-butyl-3-methyl-imidazolium hydroxide ([Bmim]OH), 1-(2-hydroxyethyl)-3-methylimidazolium tetrafluoroborate ([HEmim][$BF_4$]), and tris-(2-hydroxyethyl)-methylammonium methylsulfate (MTEOA $MeOSO_3$), among others.

The ionic liquid (salt) can be dissolved, for example, in water or an organic solvent (e.g., methanol or acetone) and combined with the block copolymer material, which can be dissolved in an organic solvent such as toluene, benzene, toluene, xylene, dimethoxyethane, ethyl acetate, cyclohexanone, etc., or, although less desirable for some semiconductor processes, a halogenated solvent such as dichloromethane ($CH_2Cl_2$), dichloroethane ($CH_2Cl_2$), chloroform, methylene chloride, a chloroform/octane mixture, etc.

The block copolymer material can also be combined with a mixture or blend of two or more compatible ionic liquids.

In some embodiments, the ionic liquid/block polymer composition or blend can include water in an amount effective to improve coordination or hydrogen-bonding during casting and promote a more rapid or longer-range ordering in the self-assembly of the polymer domains during the anneal, for example, about 0.1-10% by wt of water, based on the total weight of the composition.

The structure of both the block copolymer and the ionic liquid can be tailored to meet the length scale, orientation, organizational and functional requirements of the application. The concentration of the ionic liquid in the block copolymer material can vary and in embodiments of the method, is about 0.1-50% by wt, or about 20-50% by wt, with the balance as the block copolymer. In some embodiments, the ratio of block copolymer-to-ionic liquid (e.g., as % by wt) is according to the number of reactive atoms (e.g., oxygen atoms and/or nitrogen atoms) of the selected domain (e.g., PEO) of the block copolymer that are available for selective coordination or complexation with the cation molecule ($B^+$) of the ionic liquid, e.g., the molar ratio of the oxygen in PEO to the cation ($B^+$) of the ionic liquid, or monomer-to-ionic liquid ratio ([O]/[K], e.g., 64). In other embodiments, the ionic liquid can be included at a relatively high amount, e.g., about 1-50% by wt, to provide both complexation and a surfactant effective amount to enhance chain mobility and promote self-assembly of the polymer domains during the anneal.

In some embodiments, one of the polymer blocks (e.g., the minor domain) can be selectively doped or structured to incorporate an inorganic component or species (e.g., a filler component) during annealing, which does not interfere with the ionic liquid functionality, and will remain on the substrate as an etch resistant material (e.g., mask) upon selective removal of the other polymer domain (e.g., the major domain) or, in some embodiments, removal of both the majority and minority polymer domains. Block copolymers that incorporate an inorganic species can be prepared by techniques known in the art, for example, by a direct synthesis technique, or by incorporating atoms of an inorganic species by complexation or coordination with a reactive group of one of the polymer blocks.

For example, the block copolymer can be blended with an inorganic heat resistant material or precursor thereof, which that has a high affinity to one of the polymer chains of the block copolymer and will segregate with the polymer phase during the anneal, for example, a metal salt, an organic metal salt (e.g., lithium 2,4-pentanedionate, ruthenium 2,4-pentanedionate, etc.), a metal oxide gel, metal alkoxide polymers (e.g., alkoxysilanes and alkylalkoxysilanes), metal oxide precursor (e.g., polysilsesquioxane), metal nitride precursor, and metal fine particles. Examples of metals include silicon (Si), chromium (Cr), titanium (Ti), aluminum (Al), molybdenum (Mo), gold (Au), platinum (Pt), ruthenium (Ru), zirconium (Zr), tungsten (W), vanadium (V), lead (Pb), and zinc (Zn), among others. See, for example, US 2007/0222995 and US 2007/0289943 (Lu; Agilent Technologies Inc.), and U.S. Pat. No. 6,565,763 (Asakawa et al.).

Block copolymers that incorporate an inorganic species can also be prepared by a direct synthesis technique, for example, as described in US 2007/0222995. For example, a sequential living polymerization of a nonmetal-containing monomer (e.g., styrene monomer) followed by an inorganic species-containing monomer (e.g., ferrocenylethylmethylsilane monomer) can be used to synthesize an inorganic species-containing block copolymer (e.g., poly(styrene)-b-poly (ferrocenylmethylethylsilane) (PS-b-PFEMS).

Examples of diblock copolymers that incorporate an inorganic species include poly(styrene)-b-poly(dimethylsiloxane) (PS-b-PDMS), poly(isoprene)-b-poly(dimethylsiloxane) (PI-b-PDMS), PS-b-PFEMS, poly(isoprene)-b-poly (ferrocenylmethylethylsilane) (PI-b-PFEMS), poly(styrene)-b-poly(vinylmethylsiloxane) (PS-b-PVMS), poly(styrene)-b-poly(butadiene) (PS-b-PB) where the polybutadiene (PB) is stained by osmium tetroxide ($OsO_4$), and poly(styrene)-b-poly(vinylpyridine) (PS-b-PVP) where the pyridine group forms a coordination bond with an inorganic species, among others.

After annealing and self-assembly of the polymer blocks into the perpendicular-oriented lamellae, an oxidation process (e.g., ultraviolet (UV)-ozonation or oxygen plasma etching) can be performed to remove the organic components of one or both of the polymer domains and convert the inorganic species to form a non-volatile inorganic oxide, which remains on the substrate and can be used as a mask in a subsequent etch process. For example, the inorganic species of the PDMS and PFEM block copolymers are silicon and iron, which, upon oxidation, will form non-volatile oxides, e.g., silicon oxide ($SiO_x$) and iron oxide ($Fe_xO_y$).

Referring now to FIGS. 5-5A, the lamellar-phase block copolymer material 26 can be cast or deposited into the trenches 16 to a thickness (t) at or about the inherent pitch or L value of the block copolymer material (e.g., about ±20% of L). The block copolymer material can be deposited by spin casting (spin-coating) from a dilute solution (e.g., about 0.25-2 wt % solution) of the copolymer in a suitable organic solvent such as dichloroethane ($CH_2Cl_2$) or toluene, for example. Capillary forces pull excess block copolymer material (e.g., greater than a monolayer) into the trenches 16. The thickness of the block copolymer material 26 can be measured, for example, by ellipsometry techniques. As shown, a thin layer or film 26a of the block copolymer material can be deposited and remain on the material layer 14 outside the trenches, e.g., on the spacers 18. Upon annealing, the thin film 26a will flow into the trenches leaving a structureless brush layer on the material layer 14 from a top-down perspective.

Figure 6:
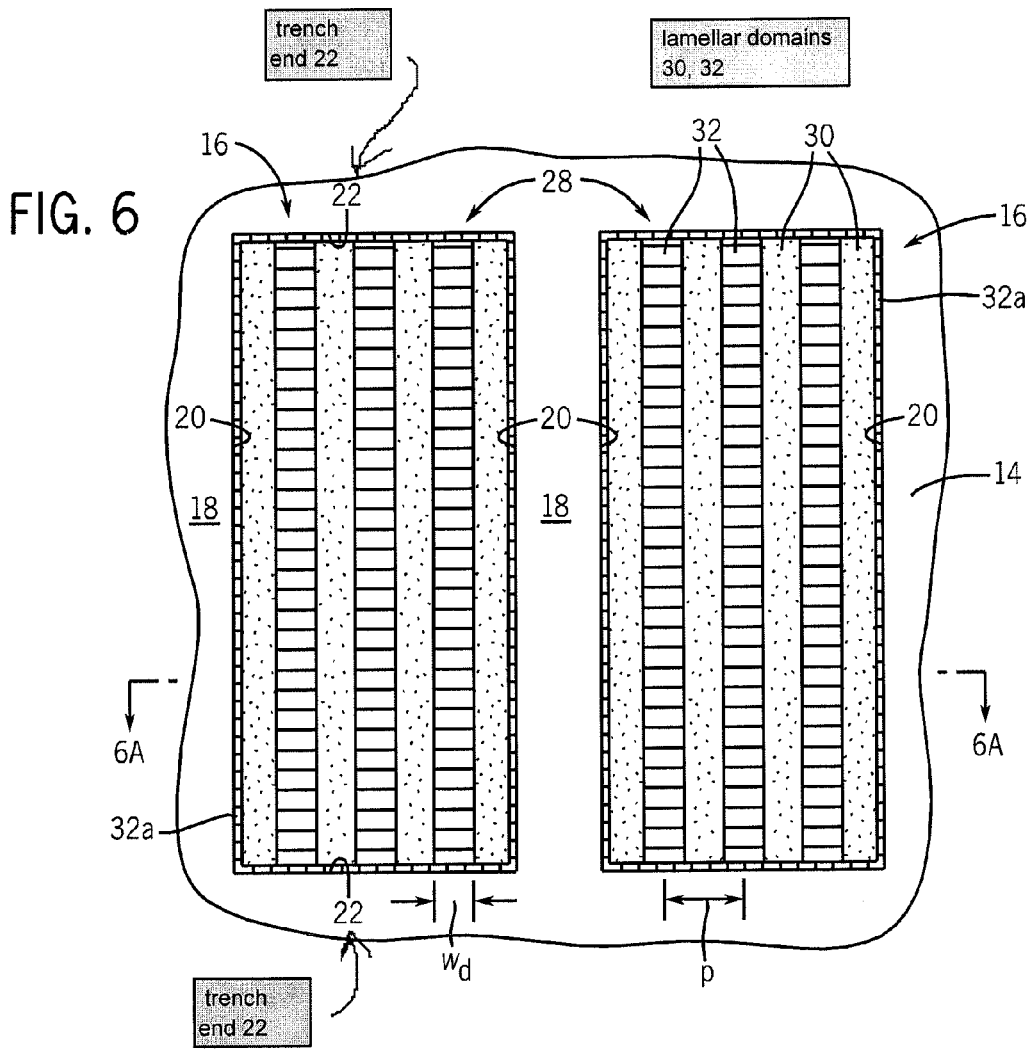
Figure 6A:
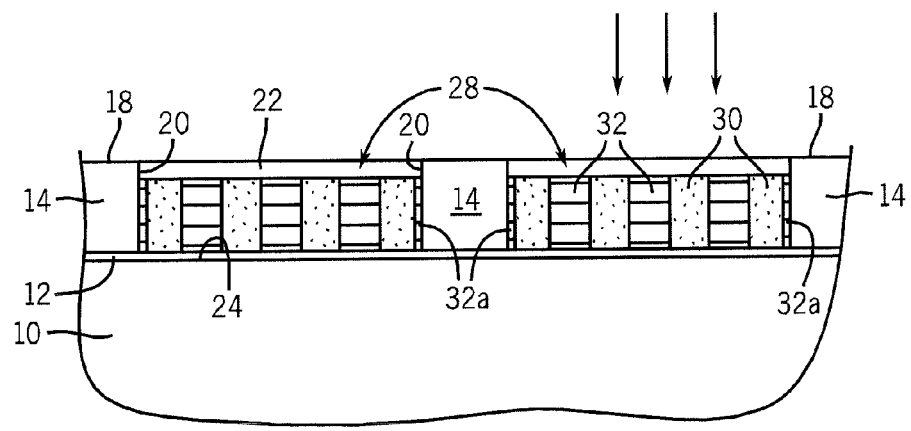

An annealing process is then conducted (arrows ↓, FIG. 6A) to cause the polymer blocks to phase separate in response to the preferential and neutral wetting of the trench surfaces and form a self-assembled polymer material 28, as illustrated in FIGS. 6 and 6A.

In embodiments of the method of the invention, the polymer material 26 is annealed by thermal annealing, which can be conducted at above the glass transition temperature ($T_g$) of the component blocks of the copolymer material. For example, a PS-b-PMMA copolymer material can be annealed at a temperature of about 180-230° C. in a vacuum oven for about 1-24 hours to achieve the self-assembled morphology. The resulting morphology of the annealed copolymer material 28 (e.g., perpendicular oriented lamellae 30, 32) can be examined, for example, using atomic force microscopy (AFM), transmission electron microscopy (TEM), scanning electron microscopy (SEM).

The block copolymer material can be globally heated or, in other embodiments, a zone or localized thermal anneal can be applied to portions or sections of the block copolymer material. For example, the substrate can be moved across a hot-to-cold temperature gradient positioned above or underneath the substrate (or the thermal source can be moved relative to the substrate) such that the block copolymer material self-assembles upon cooling after passing through the heat source. Only those portions of the block copolymer material that are heated above the glass transition temperature of the component polymer blocks will self-assemble, and areas of the material that were not sufficiently heated remain disordered and unassembled. "Pulling" the heated zone across the substrate can result in faster processing and better ordered structures relative to a global thermal anneal.

In some embodiments, the block copolymer material 26 (e.g., PS-b-PEO) is solvent annealed to form the self-assembled polymer material 28. Solvent annealing generally consists of two phases. In a first phase, the BCP material is exposed to a solvent vapor that acts to plasticize the film and increase chain mobility causing the domains to intermingle and the loss of order inherent from casting the polymer material. The organic solvent that is utilized is based at least in part on its solubility in the block copolymer material such that sufficient solvent molecules enter the block copolymer material to promote the order-disorder transition of the polymer domains and enable the required molecular rearrangement. Examples of solvents include aromatic solvents such as benzene, toluene, xylene, dimethoxyethane, ethyl acetate, cyclohexanone, etc., and chlorinated solvents such as chloroform, methylene chloride, a chloroform/octane mixture, etc., among others. In a second phase, the substrate 10 is removed from the solvent vapor and the solvent and solvent vapors are allowed to slowly diffuse out of the polymer material and evaporate. The block copolymer material begins to "dry" as the solvent evaporates from the material. The evaporation of the solvent is highly directional and forms a solvent concentration gradient extending from the "top" (surface) of the BCP material to the "bottom" of the BCP material at the trench floor 24 that induces orientation and self-assembly of structures starting at the air-surface interface and driven downward to the floor 24 of the trench 16, with formation of perpendicular-oriented lamellar domains 30, 32 guided by the trench sidewalls 20 and extending completely from the air interface to the trench floor 24.

The use of a partly- or near-saturated solvent vapor phase above the block copolymer material provides a neutral wetting interface. The concentration of solvent in the air immediate at the vapor interface with the surface of the BCP material is maintained at or under saturation as the solvent evaporates from the BCP material to maintain a neutral wetting interface such that both (or all) polymer blocks will equally wet the vapor interface and, as the solvent evaporates, will phase separate. When the concentration of solvent in the BCP material at the air interface becomes low enough, the BCP loses plasticity and the phase-separated domains at the air interface become "locked in." As the solvent concentration decreases downwardly through the BCP material, the domains formed at the air interface "seed" or drive the self-assembly downward such that the domains orient perpendicular to the substrate 10 and the lamellar features extend completely from the air interface to the trench floor 24.

In response to the wetting properties of the trench surfaces 20, 22, 24, upon annealing, the lamellar-phase block copolymer 26 will form a self-assembled polymer layer 28 composed of a single layer of perpendicular-oriented lamellar domains 30, 32 having a width ($w_d$) of about 0.5*L (e.g., 5-50 nm, or about 20 nm, for example), which extend the length and span the width of the trenches 16. A preferred block (e.g., PMMA domain) of the block copolymer material will segregate to the sidewalls 20 and ends 22 of the trench 16 to form a thin interface brush or wetting layer 32a, with the thickness of the wetting layer 32a being generally about one-fourth of the L value. Entropic forces drive the wetting of a neutral wetting surface (e.g., floor 24) by both blocks, and enthalpic forces drive the wetting of a preferential-wetting surface (e.g., sidewalls 20, ends 22) by the preferred block (e.g., the minority block).

In addition, the selective interaction and complexation of the cation ($B^+$) of the ionic liquid (salt) with reactive groups of one of the polymer blocks (e.g., O-containing groups of PMMA or PEO, etc.) enhances and/or induces perpendicular orientation of the polymer domains upon annealing, and helps control and improve the long range ordering of the lamellar domains 30, 32 (e.g., PS, PMMA) of the polymer material (e.g., PS-b-PMMA) within the trenches, and/or decreases the number of pattern errors (e.g., disclinations, etc.) in the self-assembled pattern.

In embodiments in which the block copolymer material 26 includes an inorganic species such as a metal (e.g., Si, Fe, etc.), the inorganic species will segregate to one polymer phase upon annealing.

Generally, a block copolymer thin film 26a outside the trenches (e.g., on mesas/spacers 18) will not be not thick enough to result in self-assembly. Optionally, the unstructured thin film 26a can be removed, for example, by an etch technique or a planarization process.

Optionally, the copolymer material can be treated to crosslink one of the polymer domains to fix and enhance the strength of the polymer blocks. For example, one of the polymer blocks (e.g., the PS domains) can be structured to inherently crosslink (e.g., upon exposure to ultraviolet (UV) radiation, including deep ultraviolet (DUV) radiation), or the polymer block can be formulated to contain a crosslinking agent. For example, the trench regions can be selectively exposed through a reticle (not shown) to crosslink only the self-assembled polymer material 28 within the trenches 16 and a wash can then be applied with an appropriate solvent (e.g., toluene) to remove the non-crosslinked portions of the block copolymer material 26a, leaving the registered self-assembled polymer material 28 within the trench and exposing the surface of the material layer 14 above/outside the trenches. In another embodiment, the annealed polymer material 28 can be crosslinked globally, a photoresist material can be applied to pattern and expose the areas of the polymer material 26a outside the trench regions, and the exposed portions of the polymer material 26a can be removed, for example by an oxygen ($O_2$) plasma treatment.

Figure 7:
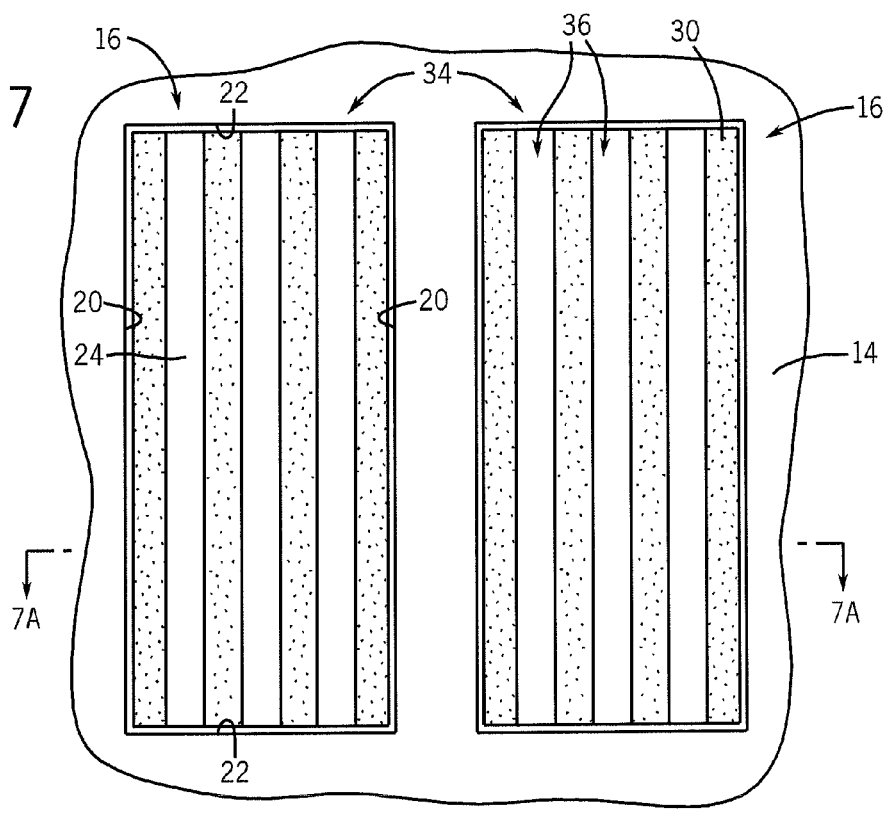
FIGS. 7 and 8 are top plan views of the substrate of FIG. 6 at subsequent stages, illustrating an embodiment of the use of the self-assembled block copolymer film after removal of one of the polymer blocks as a mask to etch the substrate and filling of the etched openings.
Figure 7A:
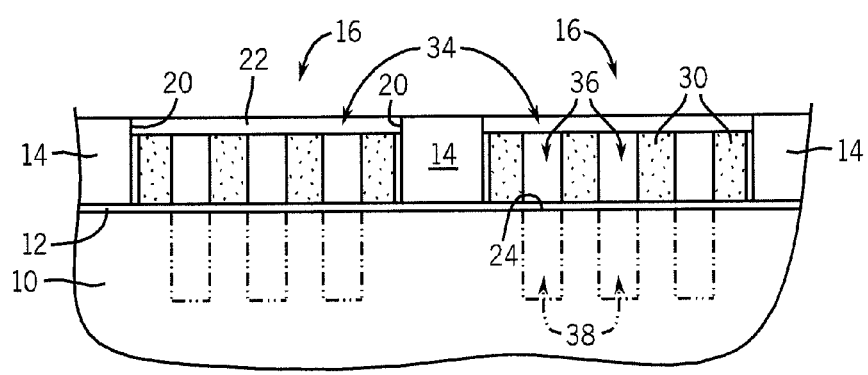
FIGS. 7A and 8A illustrate elevational, cross-sectional views of a portion of the substrate depicted in FIGS. 7 and 8 taken along lines 7A-7A and 8A-8A, respectively.

An embodiment of the use of the self-assembled polymer material 28 as an etch mask is illustrated in FIGS. 7 and 7A. As depicted, one of the lamellar domains 32 can be selectively removed to form a structure 34 composed of line openings (slits) 36 separated by the remaining lamellar domain 30, which can then be used as a mask to etch the underlying substrate 10.

For example, in using a PS-b-PMMA block copolymer, PMMA domains 32 can be selectively removed, for example, by UV exposure/acetic acid development.

Removal of water-soluble PEO phase domains 32 can be performed, for example, by exposure of the self-assembled block copolymer material 28 (optionally cross-linked) to aqueous hydroiodic acid or exposure to water alone, which will draw PEO to the surface without cleaving the bonds to the PS domains. In embodiments in which the PS-b-PEO block copolymer includes an acid-cleavable linker (e.g., trityl alcohol linker) positioned between the polymer blocks, exposure of the (crosslinked) self-assembled polymer material 28 to an aqueous acid (e.g., trifluoroacetic acid) or to an acid vapor can be performed to cleave the polymer into PEO and PS fragments (S. Yurt et al., "Scission of Diblock Copolymers into Their Constituent Blocks," *Macromolecules* 2006, 39, 1670-1672). Rinsing with water can then be performed to remove the cleaved PEO domains 32. In other embodiments, exposure to water to draw the PEO domains to the surface followed by a brief oxygen ($O_2$) plasma etch can also be performed to remove the PEO domains.

In some embodiments, the resulting films have a corrugated surface that defines a linear pattern of fine, nanometer-scale, parallel slits (openings) 36 about 5-50 nm wide and several microns in length (e.g., about 10-4000 µm), the individual slits separated by a polymer matrix 30 about 5-50 nm wide. For example, removal of the PMMA domains affords a PS mask of sublithographic dimensions, for example, a pitch of about 35 nm (17.5 nm PS domain). A smaller pitch can be dialed in by using lower molecular weight diblock copolymers.

The remaining polymer domains 30 (e.g., PS) can then be used as a lithographic template or mask to etch (arrows ↓) the underlying substrate 10 at the trench floor 24 to form a series of channels or trenches 38 (shown in phantom), e.g., using a selective reactive ion etch (RIE), or other process.

Figure 8:
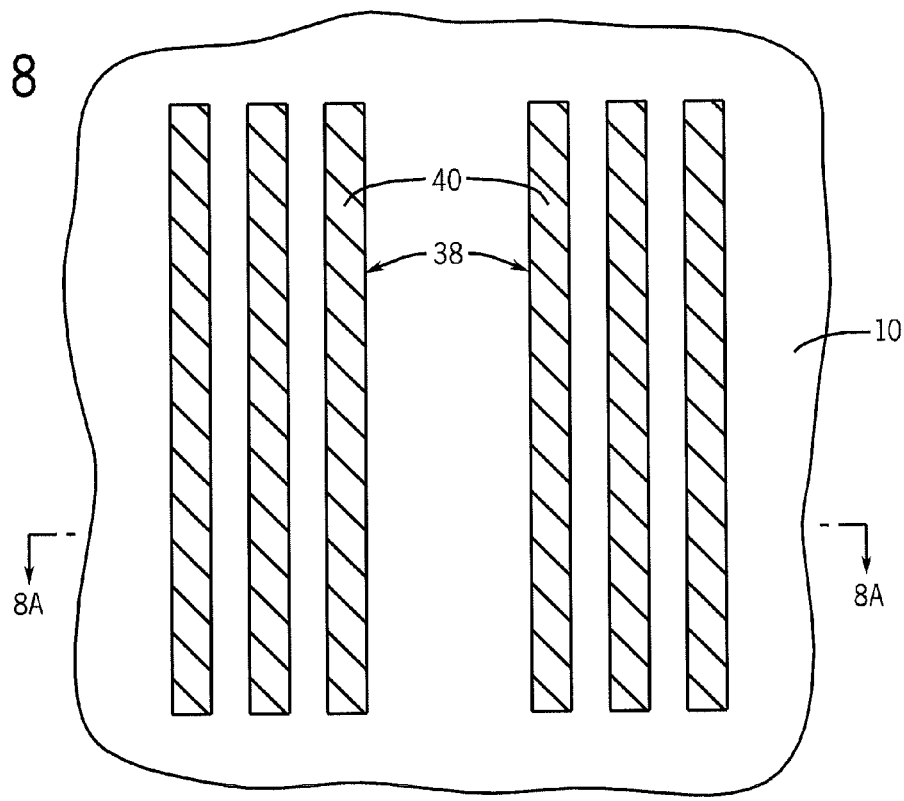
Figure 8A:
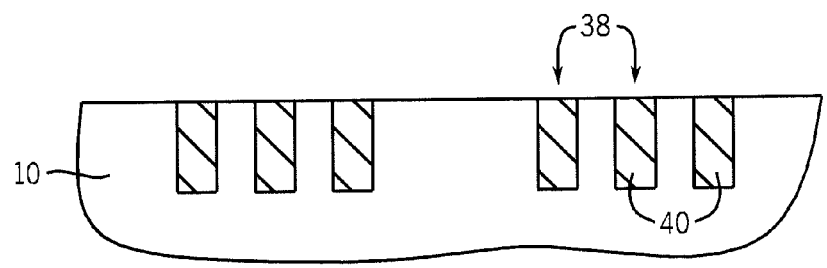

As depicted in FIGS. 8 and 8A, the residual polymer matrix 30 can be removed, e.g., by a UV-ozonation or oxygen plasma etch to remove organic material, and the line openings 38 in the substrate 10 can be filled with a material 40 such as a metal or metal alloy such as Cu, Al, W, Si, and $Ti_3N_4$, among others, to form arrays of conductive line, or with an insulating (dielectric) material such as SiO$_2$, Al$_2$O$_3$, HfO$_2$, ZrO$_2$, SrTiO$_3$, and the like. Further processing can then be performed as desired.

Figure 9:
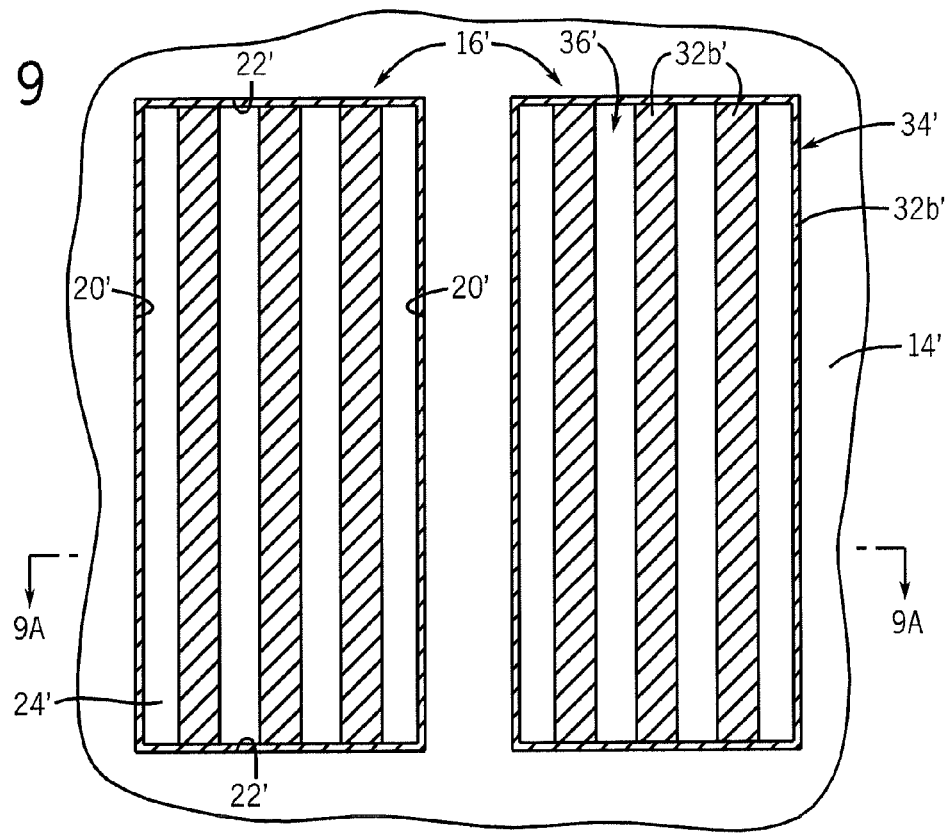
FIG. 9 is a top plan view of the substrate of FIG. 6 at a subsequent stage according to another embodiment after removal of polymer blocks with residual inorganic material as a mask on the substrate.
Figure 9A:
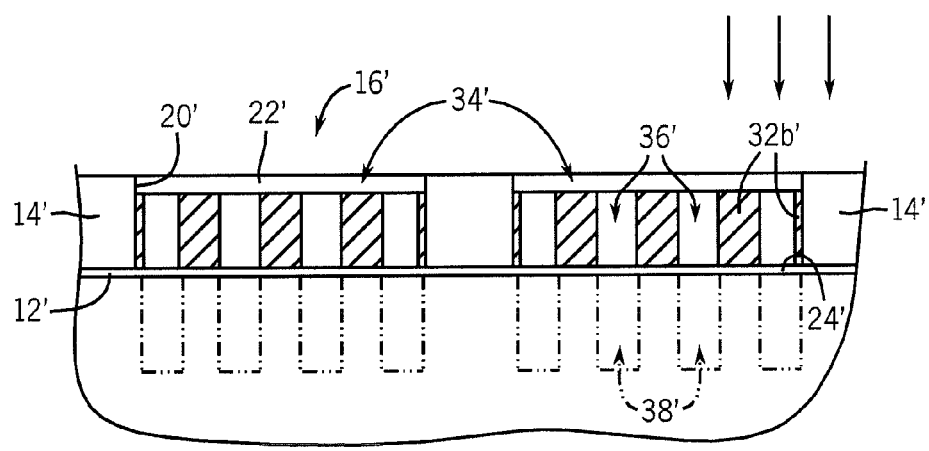
FIG. 9A is an elevational, cross-sectional view of a portion of the substrate depicted in FIG. 9 taken along line 9A-9A.

In embodiments of the invention in which one of the polymer domains includes an inorganic species (e.g., Si, Fe, etc.), an oxidation process such as a UV-ozonation or oxygen plasma etching, can be performed to remove the organic material (i.e., the polymer domains) and convert the inorganic species to a non-volatile inorganic oxide, e.g., silicon oxide (SiO$_x$), iron oxide (Fe$_x$O$_y$), etc., which remains on the substrate and can be used as a mask in a subsequent etch process. For example, a block copolymer material 26 such as PS-b-PMMA combined (e.g., doped) with a Si- and/or Fe-containing additive, and the Si and/or Fe species are segregated to the PMMA domains 32 and wetting layer 32a (FIGS. 6 and 6A). Referring to FIGS. 9 and 9A, an oxidation process (arrows ↓) can be performed to remove both the PS and PMMA lamellae (30, 32) and convert the Si and/or Fe species within the PMMA lamellae to inorganic oxide, e.g., SiO$_x$ and/or Fe$_x$O$_y$, resulting in non-volatile, inorganic oxide lines 32b' on the substrate 10'. The oxide lines 32b' can then be used as a mask to etch line openings 38' (e.g., trenches) (shown in phantom) in the substrate 10', e.g., using an anisotropic selective reactive ion etch (RIE) process. The residual oxide lines 32b' can then be removed, for example, using a fluoride-based etchant, and the substrate openings 38' can be filled with a desired material (40), similar to FIGS. 8 and 8A.

The films provide linear arrays having long range ordering and registration for a wide field of coverage for templating a substrate. The films are useful as etch masks for producing close pitched nanoscale channel and grooves that are several microns in length, for producing features such as floating gates for NAND flash with nanoscale dimensions. By comparison, photolithography techniques are unable to produce channels much below 60 nm wide without high expense. Resolution can exceed other techniques such as conventional photolithography, while fabrication costs utilizing methods of the disclosure are far less than electron beam (E-beam) or EUV photolithographies which have comparable resolution.

Figure 10B:
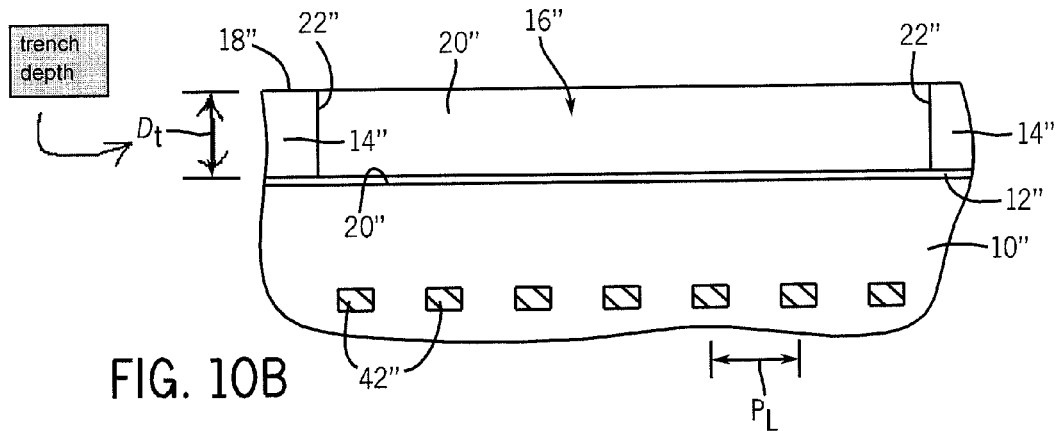
Figure 11:
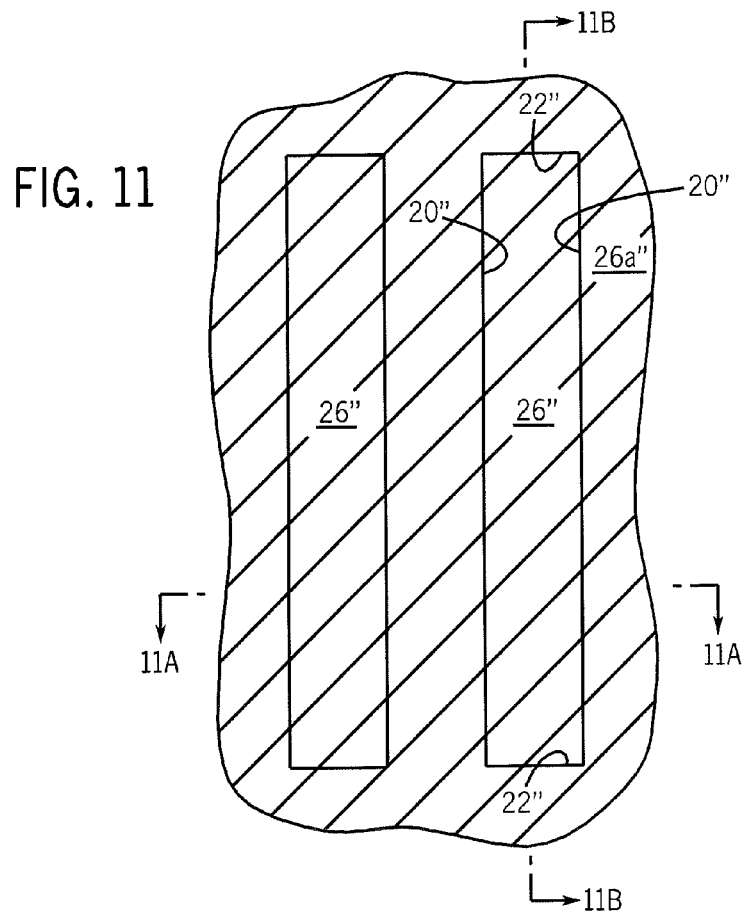
FIGS. 11 and 12 are diagrammatic top plan views of the substrate of FIG. 10 at subsequent stages in the fabrication of a self-assembled block copolymer film composed of a single row of perpendicular oriented cylinders in a polymer matrix within the trenches according to an embodiment of the disclosure.
Figure 11A:
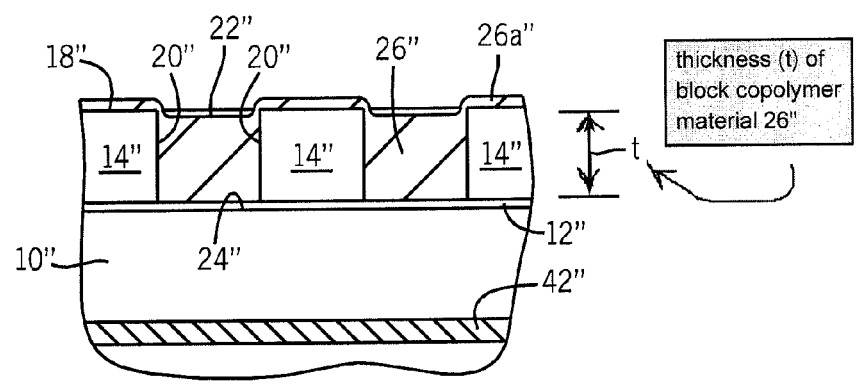
FIGS. 11A and 12A illustrate elevational, cross-sectional views of a portion of the substrate depicted in FIGS. 11 and 12 taken along lines 11A-11A and 12A-12A, respectively.
Figure 12:
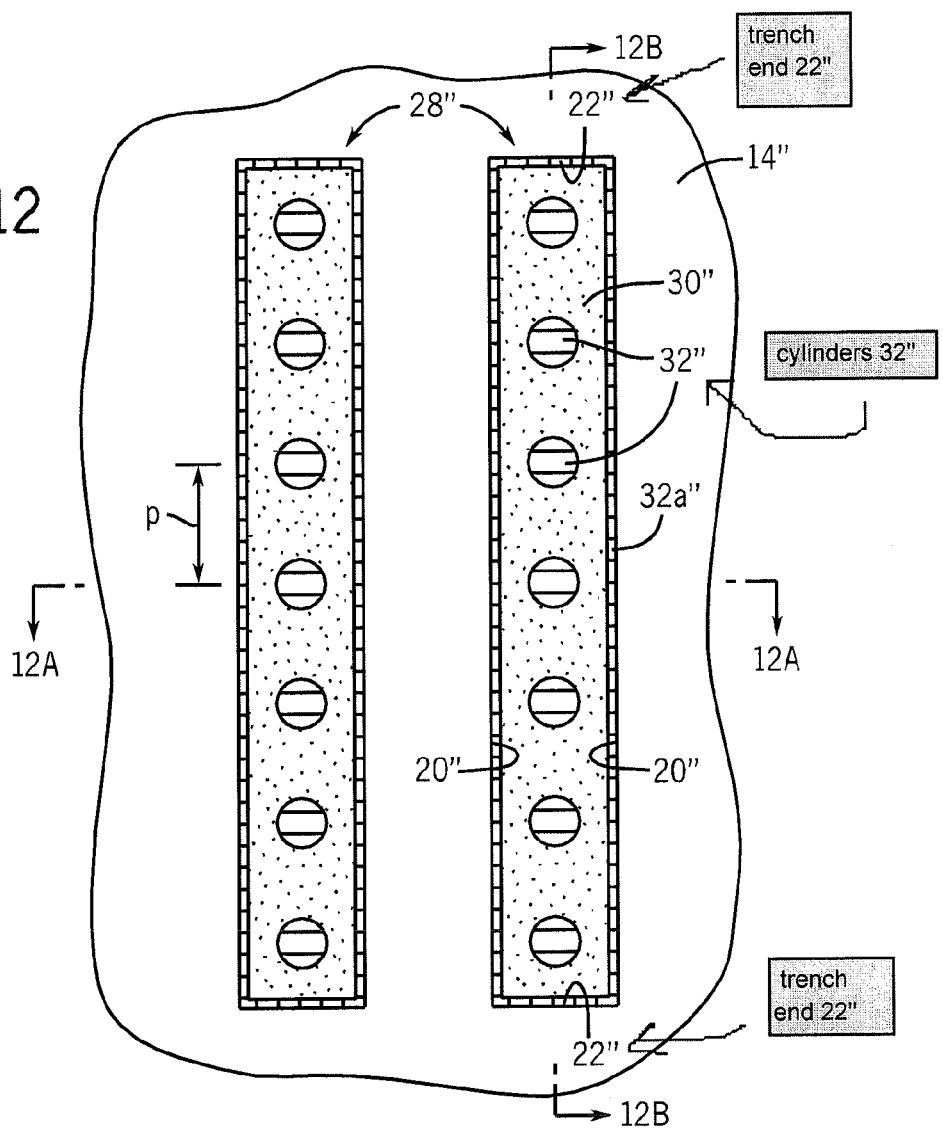
Figure 12A:
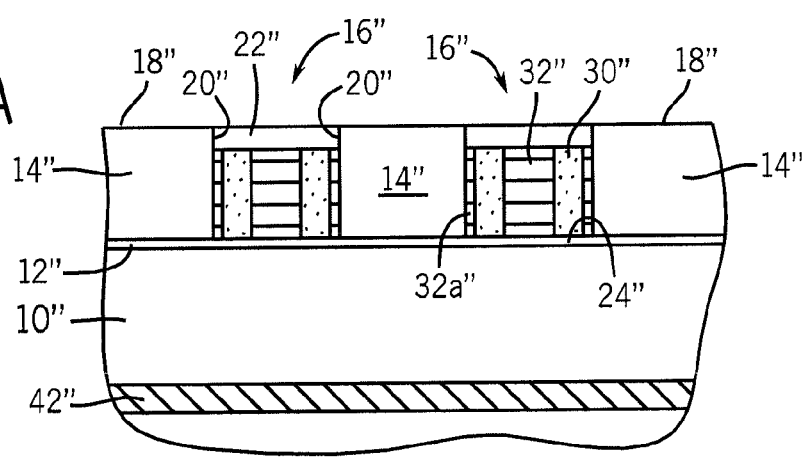

A method for fabricating a self-assembled block copolymer material that defines a one-dimensional (1-D) array of nanometer-scale, perpendicular-oriented cylinders according to an embodiment of the invention is illustrated in FIGS. 10-12. The method involves an anneal of a cylindrical-phase, block copolymer material formulated with an ionic liquid in combination with graphoepitaxy to form a 1-D array of perpendicular-oriented cylinders in a row within a polymer matrix.

As depicted in FIGS. 10-10B, a substrate 10" is provided, which can be silicon, silicon oxide, silicon nitride, silicon oxynitride, silicon oxycarbide, among other materials. As further depicted, an array of conductive lines 42" (or other active area, e.g., semiconducting regions) are situated within the substrate 10", which in the illustrated embodiment, have a center-to-center distance (or pitch, p$_L$) at or about the L value of the block copolymer material.

In the illustrated embodiment, a neutral wetting material 12" (e.g., random copolymer) has been formed over the substrate 10", as previously described, and a material layer 14" formed over the neutral wetting material and etched to form trenches 16", with mesas/spacers 18" outside and between the trenches.

A single trench or multiple trenches (as shown) can be formed in the material layer and span the entire width of an array of lines (or other active area). In the present embodiment, the trenches 16" are formed over the active areas 42" (e.g., lines) such that when the cylindrical-phase block copolymer material within the trench is annealed, each cylinder will be situated above and aligned with a single active area 42" (e.g., conductive line). In some embodiments, multiple trenches are formed with the ends 22" of each adjacent trench 16" aligned or slightly offset from each other at less than 5% of L such that cylinders of adjacent trenches are aligned and situated above the same line 42".

As previously described with reference to the embodiment using a lamellar-phase block copolymer material, the trench sidewalls 20" and ends 22" are preferential wetting to a preferred block (e.g., PMMA) of the block copolymer material, and the trench floors 24" are neutral wetting. For example, the material layer 14" can be formed from a material that is inherently preferential wetting to the PMMA block, e.g., oxide (e.g., silicon oxide, SiO$_x$), silicon (with native oxide), silicon nitride, etc., and a neutral wetting material 12" can be provided by a neutral wetting random copolymer (e.g., PS-r-PMMA) over the substrate 10" and exposed at the trench floor 24".

There is a shift from two rows to one row of the perpendicular cylinders within the center of the trench as the width (w$_t$) of the trench is decreased and/or the periodicity (L value) of the block copolymer is increased, for example, by forming a ternary blend by the addition of both constituent homopolymers. For example, a block copolymer or blend having a pitch or L value of 35-nm deposited into a 75-nm wide trench having a neutral wetting floor will, upon annealing, result in about 17.5-nm diameter (0.5*L) perpendicular cylinders that are offset by about one-half the pitch distance (or about 0.5*L) in a zigzag pattern for the length (l$_t$) of the trench, rather than perpendicular cylinders aligned with the sidewalls in a single line row down the center of the trench.

In the present embodiment, the trenches 16" are structured with a width (w$_t$) of about 1.5-2*L (or 1.5-2× the pitch value) of the block copolymer such that a cylindrical-phase block copolymer (or blend) of about L that is cast into the trench to a thickness of about the inherent L value of the block copolymer material will self-assemble into a single row of perpendicular-oriented cylinders with a diameter at or about 0.5*L and a center-to-center distance (p) of adjacent cylinders at or about L. In using a cylindrical-phase block copolymer with an about 50 nm pitch value or L, for example, the width (w$_t$) of the trenches 16 can be about 1.5-2*50 nm or about 75-100 nm to result in a single row of perpendicular-oriented cylinders (diameter≈0.5*L or about 25 nm) aligned with the sidewalls down the center of the trench. The length (l$_t$) of the trenches is at or about nL or an integer multiple of L, typically within a range of about n*10 to about n*100 nm (with n being the number of cylinders).

A diblock copolymer with volume fractions at ratios of the two blocks generally between about 60:40 and 80:20 (i.e., the major block polymer A volume fraction in the range of 0.6 to 0.8), will microphase separate and self-assemble into periodic cylindrical domains of polymer B within a matrix of polymer A. An example of a cylinder-forming PS-b-PMMA copolymer material (L$_o$~35 nm) to form about 20 nm diameter cylindrical PMMA domains in a matrix of PS is composed of about 70 wt-% PS and 30 wt-% PMMA with a total molecular weight (M$_n$) of 67 kg/mol. An example of a cylinder-forming PS-b-PVP copolymer material (L$_o$~28 nm) to form about 20 nm wide half-cylindrical PVP domains in a matrix of PS is composed of about 70 wt-% PS and 30 wt-% PVP with a total molecular weight (M$_n$) of 44.5 kg/mol. As another example, a PS-b-PLA copolymer material (L=49 nm) can be composed of about 71 wt-% PS and 29 wt-% PLA with a total molecular weight ($M_n$) of about 60.5 kg/mol to form about 27 nm diameter cylindrical PLA domains in a matrix of PS.

Figure 11B:
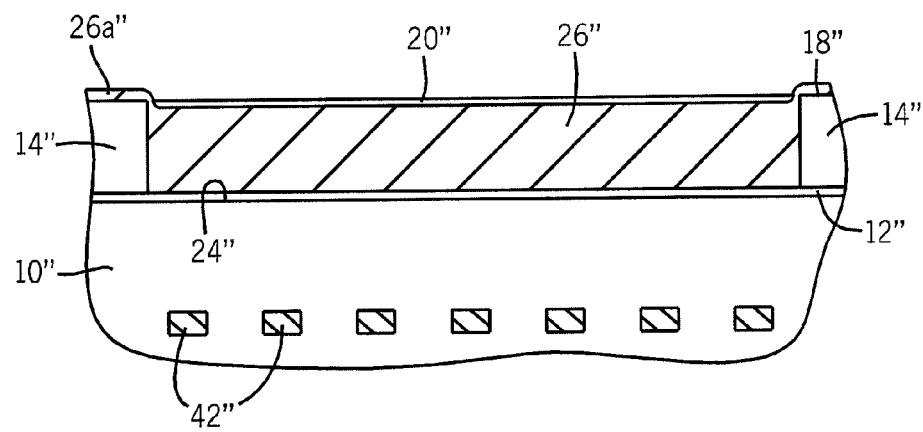

Referring now to FIGS. 11-11B, a cylindrical-phase block copolymer material 26" (or blend) having an inherent pitch at or about L is deposited into the trenches 16" to a thickness ($t_t$) at or about L (e.g., about ±20% of the L value), typically about 10-100 nm, and annealed (e.g., by thermal anneal). The block copolymer material 26" can be composed of any of the block copolymers (e.g., PS-b-PMMA, PS-b-PEO, PS-b-PLA, etc.) combined with an ionic liquid, as previously described. The block copolymer material 26" can then be thermal or solvent annealed as previously described.

As depicted in FIGS. 12-12B, upon annealing and in response to the wetting properties of the trench surfaces, the cylindrical-phase block copolymer material 26" will self-assemble into a polymer material 28" (e.g. film) composed of perpendicular-oriented cylindrical domains 32" of the minority (preferred) polymer block (e.g., PMMA) within a polymer matrix 30" of the majority polymer block (e.g., PS).

The constraints provided by the width ($w_t$) of the trench 16" and the character of the block copolymer composition (e.g., PS-b-PMMA having an inherent pitch at or about L) combined with a trench floor 24" that exhibits neutral or non-preferential wetting toward both polymer blocks (e.g., a random graft copolymer) and sidewalls 20" that are preferential wetting by the preferred (minority) polymer block, results in a 1-D array of cylindrical domains 30" of the minority polymer block (e.g., PMMA) within a matrix 30" of the majority polymer block (e.g., PS), with the cylindrical domains 32" oriented perpendicular to the trench floors 24" in a single row aligned parallel to the sidewalls 20" for the length of the trench. The diameter of the cylinders 32" will generally be about one-half of the center-to-center distance between cylinders or about 0.5*L (e.g., 5-50 nm, or about 20 nm, for example). The preferred (minority) block (e.g., PMMA) will also segregate to the sidewalls 20" and ends 22" of the trench to form a thin brush interface or wetting layer 32a" having a thickness that is generally about one-fourth of the center-to-center distance between adjacent cylinders 34. For example, a layer of PMMA domains will preferentially wet oxide interfaces, with attached PS domains consequently directed away from the oxide material. In some embodiments, the self-assembled block copolymer material 28" is defined by an array of cylindrical domains (cylinders) 32", each with a diameter at or about 0.5*L, with the number (n) of cylinders in the row according to the length of the trench, and the center-to-center distance (pitch distance, p) between each cylinder at or about L.

Polymer segments (e.g., the PS matrix 30") of the annealed polymer material 28" can be optionally be crosslinked, and any unstructured polymer material 26a" on surfaces outside the trenches can then be optionally removed, as depicted in FIGS. 11-11B.

Figure 13A:
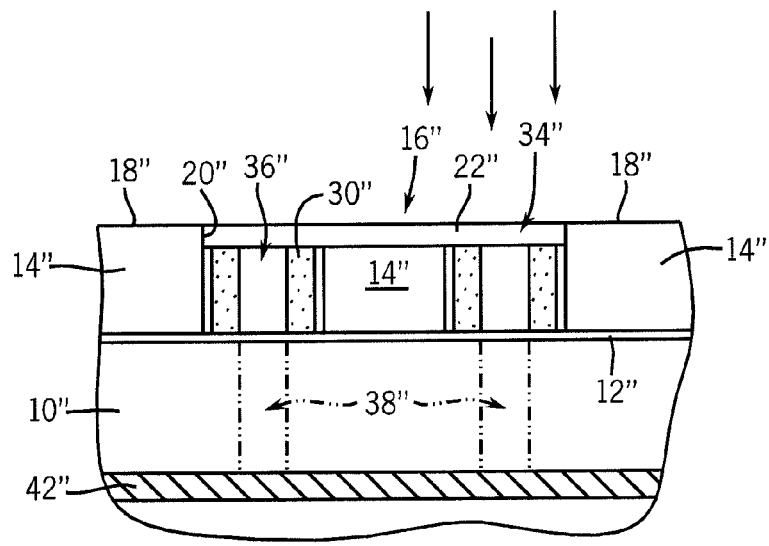
Figure 13B:
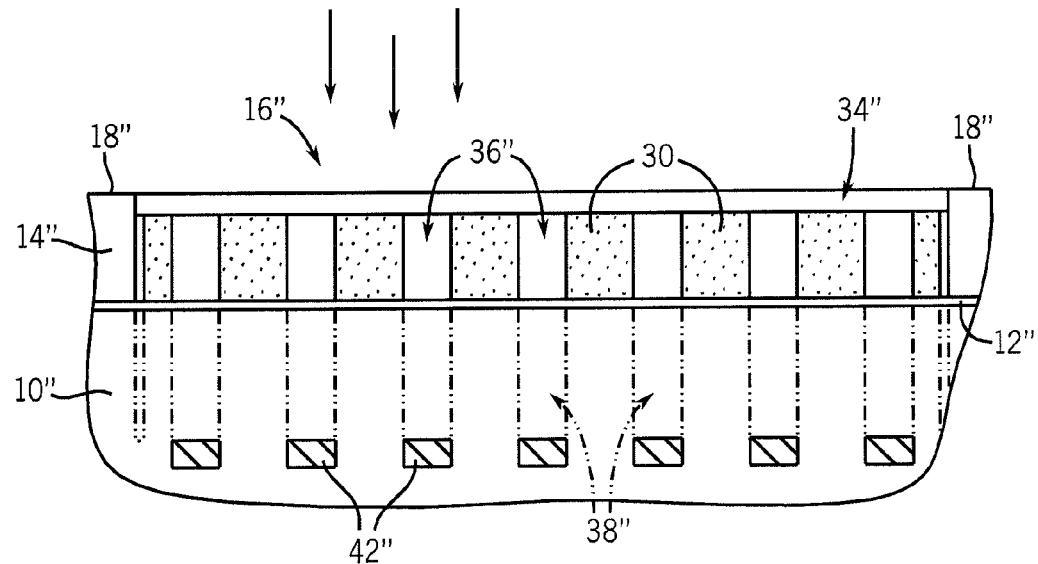
FIGS. 13B and 14B are cross-sectional views of the substrate depicted in FIGS. 13 and 14 taken along lines 13B-13B to 14B-14B, respectively.

The self-assembled polymer material 28" can then be processed, for example, to form an etch mask 34" to form cylindrical openings in the substrate 10". For example, as illustrated in FIGS. 13-13B, the cylindrical polymer domains 32" (e.g., PMMA) of the self-assembled polymer material 28" can be selectively removed resulting in a porous polymer matrix 30" (e.g., of PS) with openings 36" exposing the trench floor 24". The remaining polymer matrix 36" (e.g. PS) can be used as a mask to etch (arrows ↓) a series of openings or contact holes 38" (shown in phantom) to the conductive lines 42" or other active areas (e.g., semiconducting regions, etc.) in the underlying substrate 10" (or an underlayer), for example, using a selective reactive ion etching (RIE) process.

Figure 14B:
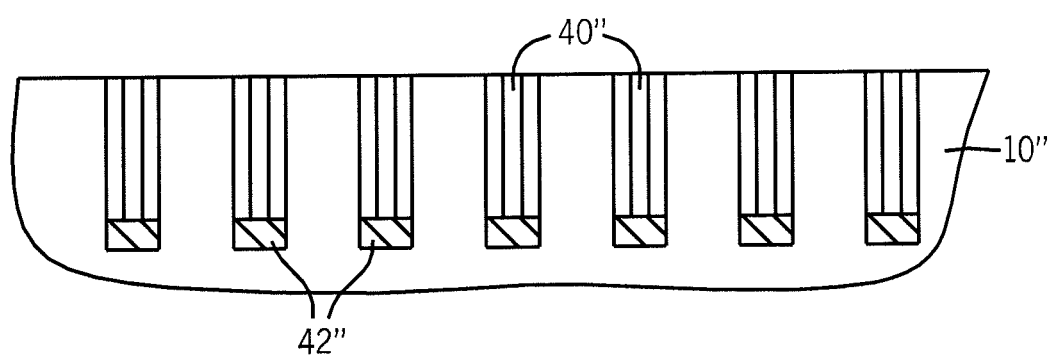

As depicted in FIGS. 14-14B, the remnants of the etch mask 34" (e.g., matrix 30") can then be removed and the cylindrical openings 38" can be filled with a desired material 40" such as a metal or metal alloy such as Cu, Al, W, Si, and $Ti_3N_4$, among others, to form arrays of cylindrical contacts to the conductive lines 42". The cylindrical openings 38" in the substrate can also be filled with a metal-insulator-metal stack to form capacitors with an insulating material such as $SiO_2$, $Al_2O_3$, $HfO_2$, $ZrO_2$, $SrTiO_3$, and the like.

Methods of the disclosure provide a means of generating self-assembled diblock copolymer films composed of perpendicular-oriented cylinders in a polymer matrix. The methods provide ordered and registered elements on a nanometer scale that can be prepared more inexpensively than by electron beam lithography, EUV photolithography or conventional photolithography. The feature sizes produced and accessible by this invention cannot be easily prepared by conventional photolithography. The described methods and systems can be readily employed and incorporated into existing semiconductor manufacturing process flows and provide a low cost, high-throughput technique for fabricating small structures.

In particular, the mixing and combination of the block copolymer material with one or more ionic liquids according to embodiments of the invention, can enhance or improve the long range ordering of the polymer domains (e.g., lamellae and cylinders) through coordination or other interaction with one phase of the block copolymer without the introduction of highly mobile contaminants such as sodium (Na), lithium (Li) or potassium (K).

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations that operate according to the principles of the invention as described. Therefore, it is intended that this invention be limited only by the claims and the equivalents thereof. The disclosures of patents, references and publications cited in the application are incorporated by reference herein.

What is claimed is:

1. A method of etching a substrate, comprising:
annealing a block copolymer material comprising an ionic liquid and situated in a trench in a material overlying a substrate, the trench having a length, opposing sidewalls and ends that are preferentially wetting to one block of the block copolymer material, and a floor that is neutral wetting to both blocks of the block copolymer material, wherein the block copolymer material forms perpendicular-oriented domains extending along the length of the trench;
selectively removing a first block of the block copolymer material to form openings exposing the substrate; and
etching the substrate through the openings.

2. The method of claim 1, further comprising, prior to removing the first block, selectively crosslinking a second block of the block copolymer material.

3. The method of claim 1, wherein a second block of the block copolymer material comprises an inorganic component.

4. The method of claim 3, wherein the inorganic component is selected from the group consisting of metals, metal salts, organic metal salts, metal oxide gels, metal alkoxide polymers, metal oxide precursors, and metal nitride precursors.

5. The method of claim 3, wherein the inorganic component comprises an element selected from the group consisting of silicon, chromium, titanium, aluminum, molybdenum, gold, platinum, ruthenium, zirconium, tungsten, vanadium, lead and zinc.

6. The method of claim 1, wherein a second block of the block copolymer material comprises a metal component, and the method further comprises, after selectively removing the first block, forming the metal component into an inorganic metal material to form a plurality of lines of the inorganic metal material on the substrate.

7. The method of claim 1, wherein etching the substrate through the openings comprise forming a pattern of parallel trenches within the substrate.

8. The method of claim 1, further comprising filling the openings in the substrate with a fill material.

9. The method of claim 8, wherein the fill material comprises a metal, a metal alloy or a metal/insulator/metal stack.

10. A method of etching a substrate, comprising:
annealing a lamellar-phase block copolymer material comprising an ionic liquid and situated in a trench in a material on a substrate, the trench having a length, a width, opposing sidewalls and ends that are preferentially wetting to a first block of the block copolymer material, and a floor that is neutral wetting to both blocks of the block copolymer material, wherein the block copolymer material forms lamellae structures perpendicular to the floor of the trench spanning the width and extending along the length of the trench;
selectively removing the first block or a second block of the block copolymer material to form openings exposing the substrate; and
etching the substrate through the openings.

11. A method of etching a substrate, comprising:
annealing a cylindrical-phase block copolymer material comprising an ionic liquid and situated in a trench in a material on a substrate, the trench having a length, a width, opposing sidewalls and ends that are preferentially wetting to a first block of the block copolymer material, and a floor that is neutral wetting to both blocks of the block copolymer material, wherein the block copolymer material forms a single row of perpendicular-oriented cylinders of the first block in a matrix of a second block, the annealed block copolymer material having a thickness, and the cylinders extending through the thickness of the annealed block copolymer material;
removing the first block to form openings exposing the substrate; and
etching the substrate through the openings.

12. A method of etching a substrate, comprising:
depositing a block copolymer material comprising an ionic liquid within a trench in a material overlying a substrate, the trench having a length, opposing sidewalls and ends that are preferentially wetting to a first block of the block copolymer material, and a floor that is neutral wetting to both blocks of the block copolymer material;
causing a microphase separation in the block copolymer material to form self-assembled polymer domains oriented perpendicular to the floor of the trench and parallel to the sidewalls along the length of the trench;
selectively crosslinking one of the self-assembled polymer domains;
removing non-crosslinked self-assembled polymer domains to form openings exposing the substrate; and
etching the substrate through the openings.

13. The method of claim 12, wherein the block copolymer material comprises a lamellar-phase block copolymer material.

14. The method of claim 12, wherein the block copolymer material comprises a cylindrical-phase block copolymer material.

15. The method of claim 1, wherein the block copolymer material comprises a copolymer selected from the group consisting of poly(styrene)-b-poly(methylmethacrylate) (PS-b-PMMA), poly(styrene)-b-poly(acrylate), poly(styrene)-b-poly(methacrylate), poly(styrene)-b-poly(vinylpyridine) (PS-b-PVP), poly(styrene)-b-poly(ethylene oxide) (PS-b-PEO), poly(styrene)-b-poly(lactide) (PS-b-PLA), poly(styrene)-b-poly(tert-butyl acrylate) (PS-b-PtBA), poly(styrene)-b-poly(ethylene-co-butylene (PS-b-(PS-co-PB)), poly (isoprene)-b-poly(methylmethacrylate) (PI-b-PMMA), poly (isoprene)-b-poly(ethyleneoxide) (PI-b-PEO), poly (styrene)-b-poly(methylmethacrylate)-b-poly(ethylene oxide) (PS-b-PMMA-b-PEO), poly(styrene)-b-poly(methylmethacrylate)-b-poly(styrene), poly(methylmethacrylate)-b-poly(styrene)-poly(methylmethacrylate), and poly(styrene)-b-poly(isoprene)-b-poly(styrene).

16. The method of claim 1, further comprising blending the block copolymer material with an inorganic heat resistant material or precursor thereof, prior to annealing the block copolymer material.

17. The method of claim 1, wherein annealing a block copolymer material comprises zone heating the block copolymer material.

18. The method of claim 1, wherein annealing a block copolymer material comprises solvent annealing the block copolymer material.

19. The method of claim 3, wherein the block copolymer material comprises a copolymer selected from the group consisting of poly(styrene)-b-poly(dimethylsiloxane), poly(isoprene)-b-poly(dimethylsiloxane), poly(styrene)-b-poly(ferrocenylmethylsilane), poly(isoprene)-b-poly (ferrocenylmethylethylsilane), poly(styrene)-b-poly (vinylmethylsiloxane), poly(styrene)-b-poly(butadiene), and poly(styrene)-b-poly(vinylpyridine).

20. The method of claim 12, wherein the ionic liquid comprises an organic cation selected from the group consisting of a substituted imidazolium, pyridinium, pyrrolidinium, phosphonium, ammonium, guanidinium, uronium, isouronium, thiouronium, and sulfonium.

21. The method of claim 12, wherein the ionic liquid comprises an anion selected from the group consisting of a formate, sulfate, sulfonate, amide, imide, methane, borate, phosphate, glycolate, antimonate, cobalt tetracarbonyl, trifluoroacetate, decanoate, alkylsulfate, alkylphosphate, and halogen.

22. The method of claim 12, wherein the ionic liquid comprises a member selected from the group consisting of 1-ethyl-3-methyl-imidazolium ethylsulfate (Emim EtOSO$_3$), 1-ethyl-3-methyl-imidazolium bis(trifluoromethylsulfonyl) imide ([Emim][TFSI]), 1-ethyl-3-methyl-imidazolium tetrafluoroborate ([Emim][BF$_4$]), 1-butyl-3-methyl-imidazolium tetrafluoroborate ([Bmim][BF$_4$]), 1-butyl-3-methyl-imidazolium hexafluorophosphate ([Bmim][PF$_6$]), 1-butyl-3-methyl-imidazolium hydroxide ([Bmim]OH), 1-(2-hydroxyethyl)-3-methylimidazolium tetrafluoroborate ([HEmim][BF$_4$]), and tris-(2-hydroxyethyl)-methylammonium methylsulfate (MTEOA MeOSO$_3$).

\* \* \* \* \*

UNITED STATES PATENT AND TRADEMARK OFFICE
CERTIFICATE OF CORRECTION

PATENT NO. : 8,641,914 B2
APPLICATION NO. : 13/474208
DATED : February 4, 2014
INVENTOR(S) : Jennifer Kahl Regner It is certified that error appears in the above-identified patent and that said Letters Patent is hereby corrected as shown below:

Title Page

On the page 4, under "Other Publications", in column 1, line 1,
delete "Makromol." and insert -- Macromol. --, therefor.

On the page 4, under "Other Publications", in column 2, line 27,
delete "Electronon" and insert -- Electron --, therefor.

On the page 5, under "Other Publications", in column 1, line 37,
delete "Filmes ," and insert -- Films, --, therefor.

On the page 5, under "Other Publications", in column 2, line 17,
delete "Macromollecular" and insert -- Macromolecular --, therefor.

On the page 5, under "Other Publications", in column 2, line 21,
delete "Bredig" and insert -- Breeding --, therefor.

On the page 7, under "Other Publications", in column 1, line 25,
delete "Languir," and insert -- Langmuir, --, therefor.

On the page 7, under "Other Publications", in column 1, line 53,
delete "Bredig" and insert -- Breeding --, therefor.

In the Claims
In column 20, line 16, in Claim 15, delete "butylene" and insert -- butylene) --, therefor.

Signed and Sealed this
Thirteenth Day of May, 2014

Michelle K. Lee
*Deputy Director of the United States Patent and Trademark Office*